(12) United States Patent
Suenaga et al.

(10) Patent No.: US 7,414,228 B2
(45) Date of Patent: Aug. 19, 2008

(54) HIGH FREQUENCY HEATING APPARATUS

(75) Inventors: Haruo Suenaga, Katano (JP); Hideaki Moriya, Yamatokoriyama (JP); Hisashi Morikawa, Kitakatsuragi-gun (JP); Shinichi Sakai, Nara (JP); Makoto Mihara, Nara (JP); Nobuo Shirokawa, Nara (JP); Toyotsubu Matsukura, Nara (JP); Masato Matsuda, Shiki-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 182 days.

(21) Appl. No.: 10/550,576

(22) PCT Filed: Apr. 9, 2004

(86) PCT No.: PCT/JP2004/005142

§ 371 (c)(1),
(2), (4) Date: Sep. 22, 2005

(87) PCT Pub. No.: WO2004/093498

PCT Pub. Date: Oct. 28, 2004

(65) Prior Publication Data

US 2006/0226141 A1    Oct. 12, 2006

(30) Foreign Application Priority Data

| Apr. 11, 2003 | (JP) | ............................. 2003-108180 |
| Jul. 2, 2003 | (JP) | ............................. 2003-270458 |
| Jul. 23, 2003 | (JP) | ............................. 2003-278578 |
| Aug. 6, 2003 | (JP) | ............................. 2003-287537 |

(51) Int. Cl.
*H05B 6/68* (2006.01)
(52) U.S. Cl. ...................... 219/716; 219/715
(58) Field of Classification Search ................ 219/716, 219/678, 715, 702
See application file for complete search history.

(56) References Cited

U.S. PATENT DOCUMENTS

| 4,319,317 | A | * | 3/1982 | Fukui et al. ................. 363/124 |
| 4,336,569 | A | * | 6/1982 | Tsuda et al. ................ 361/736 |
| 4,812,617 | A | * | 3/1989 | Takeuji et al. ............... 219/757 |
| 4,843,202 | A | * | 6/1989 | Smith et al. ................. 219/716 |
| 4,868,362 | A | * | 9/1989 | Takeuji ....................... 219/757 |

FOREIGN PATENT DOCUMENTS

EP    0 289 032    11/1988

(Continued)

*Primary Examiner*—Daniel L Robinson
(74) *Attorney, Agent, or Firm*—Pearne & Gordon LLP

(57) ABSTRACT

There is constructed a constitution such that a shunt resistor 30 is interposed in series with a portion capable of measuring an output current of a unidirectional power source portion 1 of a high frequency heating apparatus and a voltage generated at the shunt resistor 30 is outputted by a buffer 31. Further, an operational amplifier 3101 having a high input impedance is used for the buffer 31. Further, a diode bridge 101 and a semiconductor switching element 205 are fixed to a common heat radiating plate 33, the heat radiating plate 33 is formed with a notched portion 33a to thereby ensure insulating distances to the diode bridge 101 and the semiconductor switching element 205, and the shunt resistor 30 is arranged on a straight line the same as that between the diode bridge 101 and the semiconductor switching element 205.

18 Claims, 17 Drawing Sheets

FOREIGN PATENT DOCUMENTS

| | | |
|---|---|---|
| EP | 0 507 532 | 10/1992 |
| JP | 55-103982 | 7/1980 |
| JP | 64-065794 | 3/1989 |
| JP | 4-10382 | 1/1992 |
| JP | 5-121162 | 5/1993 |
| JP | 6-165525 | 6/1994 |
| JP | 8-96947 | 4/1996 |
| JP | 8-227791 | 9/1996 |
| JP | 09-312450 | 2/1997 |
| JP | 09-311078 | 12/1997 |
| JP | 10-066309 | 3/1998 |
| JP | 10-220819 | 8/1998 |
| JP | 11-144858 | 5/1999 |
| JP | 11-144860 | 5/1999 |
| JP | 11-195889 | 7/1999 |
| JP | 2001-185339 | 7/2001 |
| JP | 2001-217101 | 8/2001 |
| JP | 2002-246166 | 8/2002 |
| JP | 2003-203755 | 7/2003 |
| JP | 2003-287537 | 7/2007 |

\* cited by examiner

US 7,414,228 B2

HIGH FREQUENCY HEATING APPARATUS

This application claims the benefit of International Application Number PCT/JP2004/005142, which was published in English on OCT. 28, 2004.

TECHNICAL FIELD

The present invention relates to a high frequency heating apparatus preferably used in an apparatus having a magnetron of an electronic range or the like.

BACKGROUND ART

In an prior art, there are proposed the above-described high frequency heating apparatus adopting a constitution of detecting an input current supplied by a commercial power source by a current transformer and controlling constant an output of an electromagnetic wave of the magnetron by carrying out a pulse width control such that the input current becomes a predetermined value (refer to, for example, Patent Reference 1) and adopting a constitution of detecting a secondary side current of a boost transformer of a high voltage circuit and controlling an input current constant (refer to, for example, Patent Reference 2).

Further, there is also proposed a high frequency heating apparatus adopting a constitution of detecting a secondary side current of a boost transformer of a high voltage circuit by a current transformer and stopping to operate an inverter power source when an abnormality is brought about at the high voltage circuit (refer to, for example, Patent Reference 3).

[Patent Reference 1] JP-A-8-96947
[Patent Reference 2] JP-A-8-227791
[Patent Reference 3] JP-A-5-121162

In all of the high frequency heating apparatus, the current constituting an object to be detected is detected by the current transformer.

An explanation will be given here of the high frequency heating apparatus proposed in Patent Reference 2.

FIG. 9 is a circuit diagram showing the constitution of the high frequency heating apparatus proposed in Patent Reference 2. The high frequency heating apparatus shown in the drawing is constituted by a unidirectional power source portion 1, an inverter portion 2, a high voltage rectifier circuit 3, a magnetron 4, a switching rate detecting portion 5, a secondary side current detecting portion 6, a control portion 7 and current transformers 8 and 9.

The unidirectional power source portion 1 is constituted by a diode bridge 101 for subjecting an alternating current power source from a commercial power source 20 into full-wave rectification, and a low pass filter circuit comprising a choke coil 102 and a capacitor 103. Further, in the unidirectional power source portion 1, the above-described current transformer 8 is interposed to a side of an alternating current input of the diode bridge 101 and used for detecting an input current. The inverter portion 2 is constituted by a resonant capacitor 201, a boost transformer 202, a transistor 203 and a commutating diode 204. The transistor 203 is operated to switch by a switching control signal of 20 through 50 kHz provided from the control portion 7. Thereby, a high frequency voltage is generated at a primary winding of the boost transformer 202. Further, the transistor 203 is referred to as IGBT (Insulated Gate Bipolar Transistor) by being formed integrally mainly with the commutating diode 204.

The high voltage rectifying circuit 3 is constituted by capacitors 301 and 302 and diodes 303 and 304 and generates a high direct current voltage by subjecting a voltage generated at a secondary winding of the boost transformer 202 to half-wave multiplying rectification to apply to the magnetron 4. The magnetron 4 is also applied with an alternating current voltage for a heater from a heater winding of the boost transformer 202. The magnetron 4 is brought into an emittable state by heating a cathode thereof by being applied with the alternating current voltage for the heater and generates electromagnetic energy when the high direct current voltage is applied thereto under the state. The high voltage rectifier circuit 3 is interposed with the current transformer 9 between a cathode of the diode 303 and the ground to be used for detecting a secondary current.

The switching rate detecting portion 5 detects an ON/OFF duty ratio of the transistor 203 of the inverter portion 3 and inputs a result thereof to the control portion 7. The secondary side current detecting portion 6 subjects the secondary current to full-wave rectification to detect an average value thereof and inputs a result thereof to the control portion 7. The control portion 7 multiplies an output signal of the switching rate detecting portion 5 by an output of the secondary side current detecting portion 6 to control the transistor of inverter portion 3 to ON/OFF such that a multiplied value becomes a desired value. In this way, the commercial power source 20 is converted into a unidirection voltage by the unidirectional power source portion 1, the converted voltage is converted into a high frequency voltage by the inverter 2 and boosted up by the boost transformer 202 and thereafter converted into a high direct current voltage again by being subjected to multiplying rectification by the high voltage rectifier circuit 3 to thereby drive the magnetron 4.

However, according to the high frequency heating apparatus of the prior art, the following problem is posed.

That is, the current transformer is used for detecting the input current, the current transformer per se is comparatively large-sized and therefore, the current transformer constitutes a hindrance in space saving formation, further, also the cost is comparatively high and therefore, the current transformer also constitutes a hindrance in a reduction in the cost.

Further, the current transformer is provided with a frequency characteristic and cannot detect a direct current in view of a structure thereof and therefore, when a position of inserting the current transformer is disposed at the alternating current input of the diode bridge 101 as shown by FIG. 9, a detection sensitivity differs by a difference between frequencies (50/60 Hz) of the commercial power source and therefore, when the input current is controlled by receiving an output of the current transformer at the control portion 7, reference signals need to provide in correspondence with the respective frequencies of the commercial power source.

Further, the current transformer is magnetically coupled with other magnetic circuit in view of the structure and therefore, the current transformer is liable to receive noise of the boost transformer 202 and there is a concern of inputting a signal including the noise to the control portion 7 to operate erroneously.

Further, the current transformer per se is constituted by a size to some degree and therefore, an interval of arranging the current transformer, the diode bridge 101 and the transistor 203 is prolonged to some degree and therefore, a wiring pattern on a printed board connecting these is also prolonged and noise can be generated. Also in this case, similar to the above-described, the control portion 7 is erroneously operated by the noise or an adverse influence is effected on a contiguous apparatus.

Further, although there is carried out a countermeasure against heat generation with regard to IGBT constituted by integrally forming the transistor 203 and the commutating diode 204 other than the diode bridge 101 on the printed board and the boost transformer 202 by using a cooling fan, a sufficient cooling efficiency cannot be achieved since the current transformers 8 and 9 having large shapes hamper flow of cooling wind and a cement resistor constitutes a heat generating source. Particularly, all the parts need to arrange in a limited space on the printed board in accordance with small-sized formation of a main body of the high frequency heating apparatus and therefore, an increase in the cooling efficiency is desired.

DISCLOSURE OF INVENTION

The invention has been carried out in view of such a point and it is an object thereof to provide a high frequency heating apparatus capable of detecting an input current at low cost and without taking much space and capable of minimizing generation of noise. Further, it is an object thereof to provide a high frequency heating apparatus including a power source unit having an excellent cooling efficiency.

Further, it is an object thereof to provide a high frequency heating apparatus capable of carrying out an accurate high frequency resonating control for a magnetron by maintaining an input current constant even when an atmospheric temperature is changed in accordance with elapse of cooking time period and preventing a semiconductor element, a magnetron or the like from being destructed by an abnormal temperature rise.

A high frequency heating apparatus of the invention is characterized in a high frequency heating apparatus comprising a unidirectional power source portion for converting a commercial power source in a unidirection, an inverter portion including at least one piece of a semiconductor switching element for converting a power from the unidirectional power source portion into a high frequency power by making the semiconductor switching element ON/OFF, a boost transformer for boosting an output voltage of the inverter, a high voltage rectifying portion for subjecting an output voltage of the boost transformer to multiplying voltage rectification and a magnetron for irradiating an output of the high voltage rectifying portion as an electromagnetic wave, further comprising a shunt resistor interposed in series with a portion capable of measuring an output current of the unidirectional power source portion, a buffer for outputting a voltage generated by making a current flow to the current resistor, and a control portion for controlling the semiconductor switching element ON/OFF to control an output of the buffer constantly to a predetermined value.

According to the constitution, the voltage generated at the shunt resistor is outputted by interposing the shunt resistor in series with the portion capable of measuring the output current of the unidirectional power source portion and therefore, in comparison with the case of using a current transformer as in the prior art, a reduction in cost can be achieved and space saving formation can be achieved since the apparatus can be made to be small-sized. Further, erroneous operation of the control portion and an influence thereof on a contiguous apparatus can be excluded by minimizing noise generated in the case of using the current transformer.

Preferably, the buffer is provided with an operational amplifier having a high input impedance, and the shunt resistor is interposed between input ends of the operational amplifier via a resistor element.

According to the constitution, by using the operational amplifier having the high input impedance, a range of using the shunt resistor is widened and a shunt resistor having an optimum value can be selected in accordance with a design specification of the high frequency heating apparatus.

Further, preferably, the unidirectional power source portion includes a rectifying element for subjecting an alternating current power source to full-wave rectification, the rectifying element and the semiconductor switching element are attached to a same heat radiating plate, the heat generating plate is formed with a notched portion for ensuring constant distances between respective terminals of the rectifying element and the semiconductor switching element and the heat radiating plate, and the shunt resistor is arranged between the rectifying element and the semiconductor switching element at a vicinity of the heat radiating plate and on a straight line the same as a straight line of the rectifying element and the semiconductor switching element.

According to the constitution, the heat radiating plate ensures insulating distances to the rectifying element and the semiconductor switching element and the shunt resistor by forming the notched portion and therefore, an accident by shortcircuit can be prevented beforehand. Further, since the shunt resistor, the rectifying element and the semiconductor switching element are arranged on the same straight line above the printed board and therefore, optimization of a wiring pattern above the printed board can be achieved, generation of noise from the pattern can be restrained to be low and erroneous operation of the control portion and an influence thereof on a contiguous apparatus can be minimized.

Further, preferably, the shunt resistor is arranged at inside of the notched portion of the heat radiating plate. According to the constitution, further space saving formation can be achieved by arranging the shunt resistance at inside of the notched portion of the heat radiating plate.

Further, preferably, the shunt resistor is a bare resistor wire. According to the constitution, the space saving formation can further be achieved and a reduction in cost can be achieved by using the bare resistor wire as the shunt resistor.

Further, preferably, the shunt resistor is arranged at a conductive through hole on a board. According to the constitution, the voltage generated at the shunt resistor is outputted by the buffer by inserting the shunt resistor in series with a portion capable of measuring the output current of the unidirectional power source portion and therefore, in comparison with the case of using the current transformer as in the prior art, a reduction in cost can be achieved and space saving formation can be achieved since the apparatus is made to be able to be small-sized. Further, erroneous operation of the control portion and an influence thereof on a contiguous apparatus can be excluded by minimizing noise generated when the current transformer is used.

Further, preferably, the shunt resistor is arranged along a wind path of a cooling wind flowing above the printed board. According to the constitution, the shunt resistor used for measuring the output current of the unidirectional power source portion is arranged above the printed board along the wind path of the cooling wind flowing above the printed board in place of the current transformer generally having a large shape and therefore, in comparison with the current transformer, a rate of hampering flow of the cooling wind by the shunt resistor can be minimized and an increase in the cooling efficiency can be achieved.

Further, preferably, the shunt resistor is arranged in a direction minimizing an area thereof to which the cooling wind is blown. According to the constitution, the shunt resistor is arranged in the direction minimizing the area to which the cooling wind is blown and therefore, the rate of hampering the flow of the cooling wind by the shunt resistor can be minimized and the increase in the cooling efficiency can be achieved.

Further, preferably, a cement resistor for lowering a voltage of the commercial power source to a predetermined voltage is arranged in a direction substantially intersecting with the wind path of the cooling wind. According to the constitution, the cement resistor accompanied by heat generation is arranged in the direction substantially intersecting with the wind path of the cooling wind and therefore, the cement resistor can efficiently be cooled.

Further, preferably, the cement resistor is arranged on a downstream side of a wind of the shunt resistor. According to the constitution, the shunt resistor is arranged above the printed board along the wind path of the cooling wind flowing above the printed board and therefore, the rate of hampering the flow of the cooling wind by the shunt resistor can be minimized, thereby, the cement resistor arranged on the downstream side of the wind of the shunt resistor can efficiently be cooled.

Further, preferably, the cement resistor is arranged in a space formed between a cooling fin attached with an electronic part generating heat and the boost transformer and at a position cooled by a cooling wind flowing in a clearance formed between the boost transformer and the printed board. According to the constitution, the shunt resistor is arranged above the printed board along the wind path of the cooling wind flowing above the printed board and therefore, the rate of hampering flow of the cooling wind by the shunt resistor can be minimized, thereby, the cement resistor arranged on the downstream side of the wind of the shunt resistor can efficiently be cooled.

A method of mounting a shunt resistor according to the invention is characterized in a method of mounting a shunt resistor in a high frequency heating apparatus comprising a unidirectional power source portion for converting a commercial power source into a unidirection, an inverter portion including at least one piece of a semiconductor switching element for converting a power from the unidirectional power source portion into a high frequency power by making the semiconductor switching element ON/OFF, and a shunt resistor for measuring an output current of the unidirectional power source portion, the method comprising the steps of separately arranging a rectifying element for subjecting an alternating current power source of the unidirectional power source portion to full-wave rectification and the semiconductor switching element on a same straight line above a printed board, and arranging the shunt resistor between the rectifying element and the semiconductor switching element and on a straight line the same as a straight line of the rectifying element and the semiconductor switching element.

According to the method, the shunt resistor and the rectifying element and the semiconductor switching element are arranged on the same straight line of the printed board and therefore, space saving formation can be realized since optimization of wiring pattern above the printed board can be achieved. Further, emittance of noise from the wiring pattern can be restrained to be low and therefore, erroneous operation of the control portion and the influence thereof on a contiguous apparatus by the noise can be minimized.

Further, a high frequency heating apparatus of the invention is a high frequency heating apparatus comprising a rectifying and smoothing portion for generating an inverter power source voltage from the commercial power source, an inverter portion including a semiconductor switching element for converting a power from the rectifying and smoothing portion into a high frequency power by making the semiconductor switching element ON/OFF, a shunt resistor for detecting an input current flowing from the rectifying and smoothing portion to the inverter portion, a direct current power source portion including a zener diode for generating a direct current power source, a reference value generating portion for generating a reference value for controlling constant the input current from the direct current power source generated by the direct current power source portion, and a control portion for calculating a difference between the reference value and a value of the input current based on the reference value generated by the reference value generating portion and controlling the inverter portion by adding the difference between the reference value and the input current value at least above a printed board, wherein the shunt resistor is provided with a temperature characteristic the same as or proximate to a temperature characteristic of the zener diode.

According to the constitution, even when the reference value is increased by increasing the zener voltage by elevating the atmospheric temperature, a value of the shunt resistor is increased by following the increase to cancel an amount of increasing the reference value and therefore, the input current can be controlled constant. Therefore, an accurate high frequency resonating control can be carried out for the magnetron for maintaining the input current constant even when the atmospheric temperature is elevated.

Further, preferably, the shunt resistor is arranged at a vicinity of the zener diode above the printed board. According to the constitution, the shunt resistor and the zener diode are disposed in the same temperature atmosphere and therefore, an error of a correlation between the input current and the reference value can be minimized.

Further, preferably, the shunt resistor is characterized in being arranged above the printed board at a location under a temperature atmosphere proximate to a temperature atmosphere of a location of arranging the zener diode. According to the constitution, the shunt resistor is mounted at the location under the temperature atmosphere the same as the location of mounting the zener diode and therefore, even when the shunt resistor cannot be arranged at a vicinity of the zener diode in view of circuit design, the error of the correlation between the input current and the reference value can be minimized.

BEST MODE FOR CARRYING OUT THE INVENTION

A detailed explanation will be given of embodiments of the invention in reference to the drawings as follows.

First Embodiment

Figure 1:
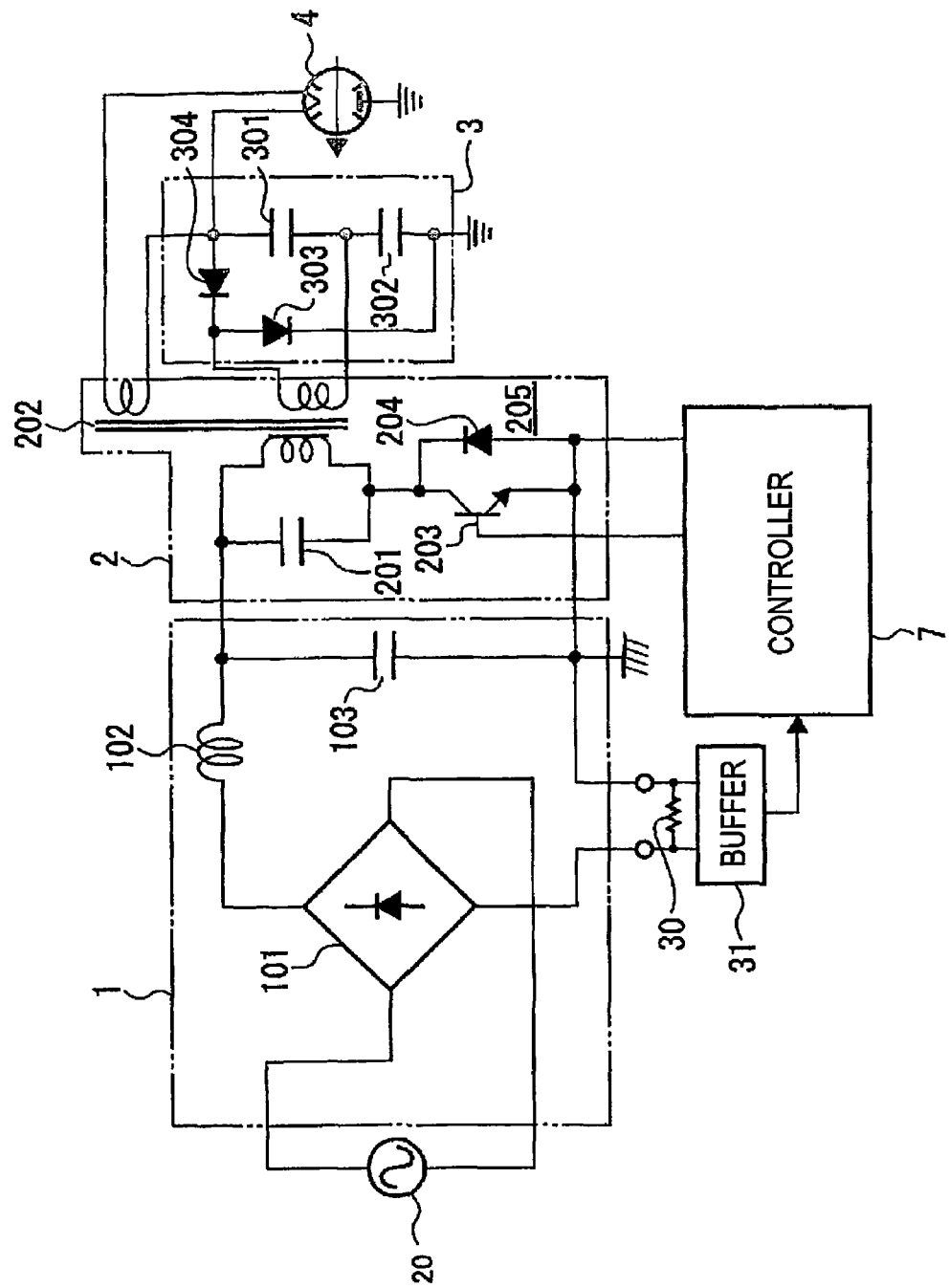
FIG. 1 is a circuit diagram showing a constitution of a high frequency heating apparatus according to an embodiment of the invention.
Figure 9:
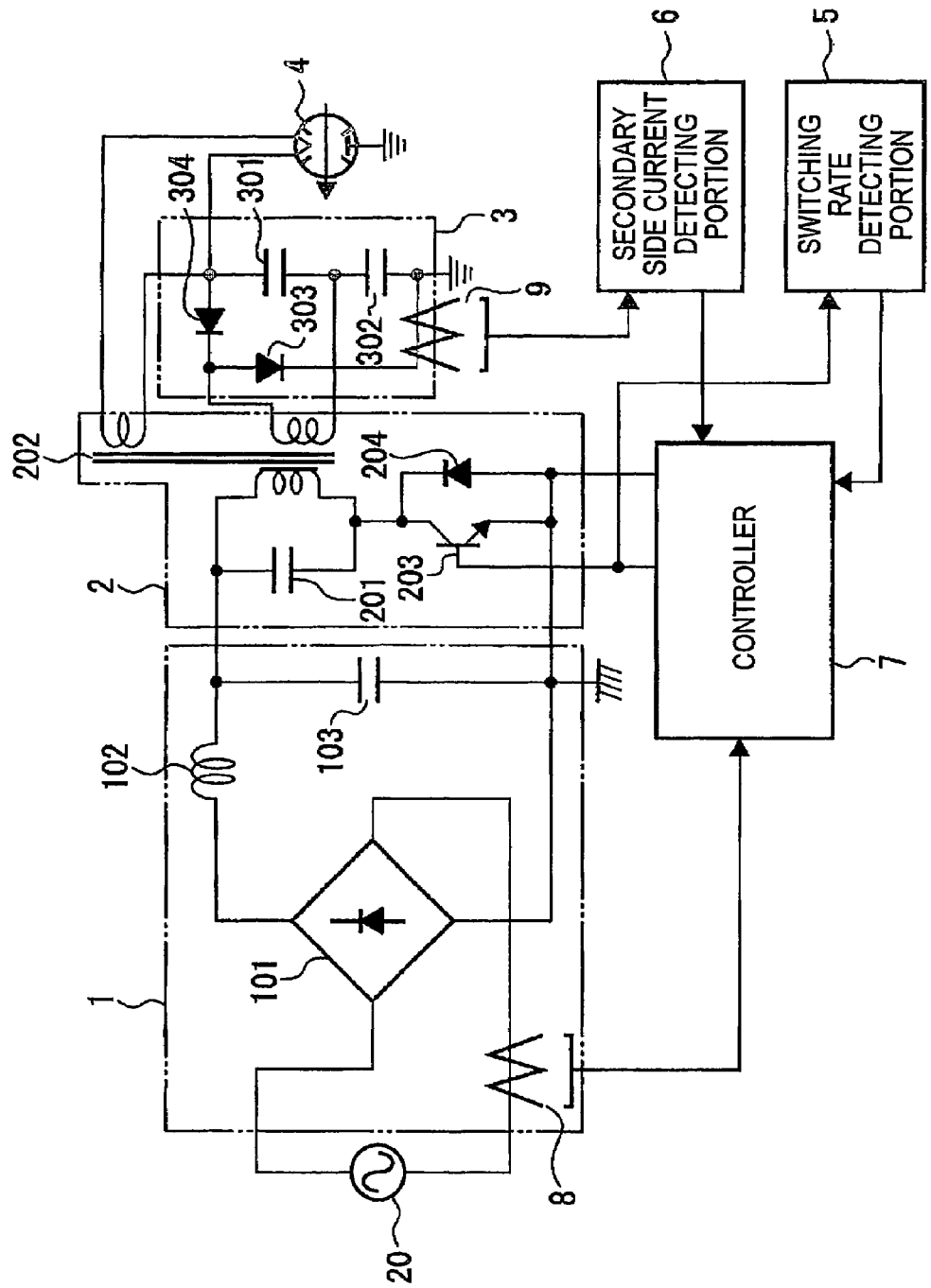
FIG. 9 is a circuit diagram showing a constitution of a high frequency heating apparatus of a prior art.

FIG. 1 is a diagram showing a constitution of a high frequency heating apparatus according to an embodiment of the invention. Further, in the drawing, portions common to those of FIG. 9, mentioned above, are attached with the same notations and an explanation thereof will be omitted.

The high frequency heating apparatus of the embodiment differs from the high frequency heating apparatus of the prior art in including a shunt resistor 30 for detecting an input current and a buffer 31 for taking out a voltage generated at the shunt resistor 30.

Further, as the shunt resistor 30, a bare resistor wire is used different from a type of being attached to a heat radiating plate or a cement mold type as in the prior art. By using the bare resistor wire, in comparison with the prior art, space saving formation is achieved and a reduction in cost is achieved.

The shunt resistor 30 is inserted in series with a negative output side terminal of the diode bridge 101 of the unidirectional power source portion 1. Further, a description will be given later of mounting the shunt resistor 30.

Figure 2:
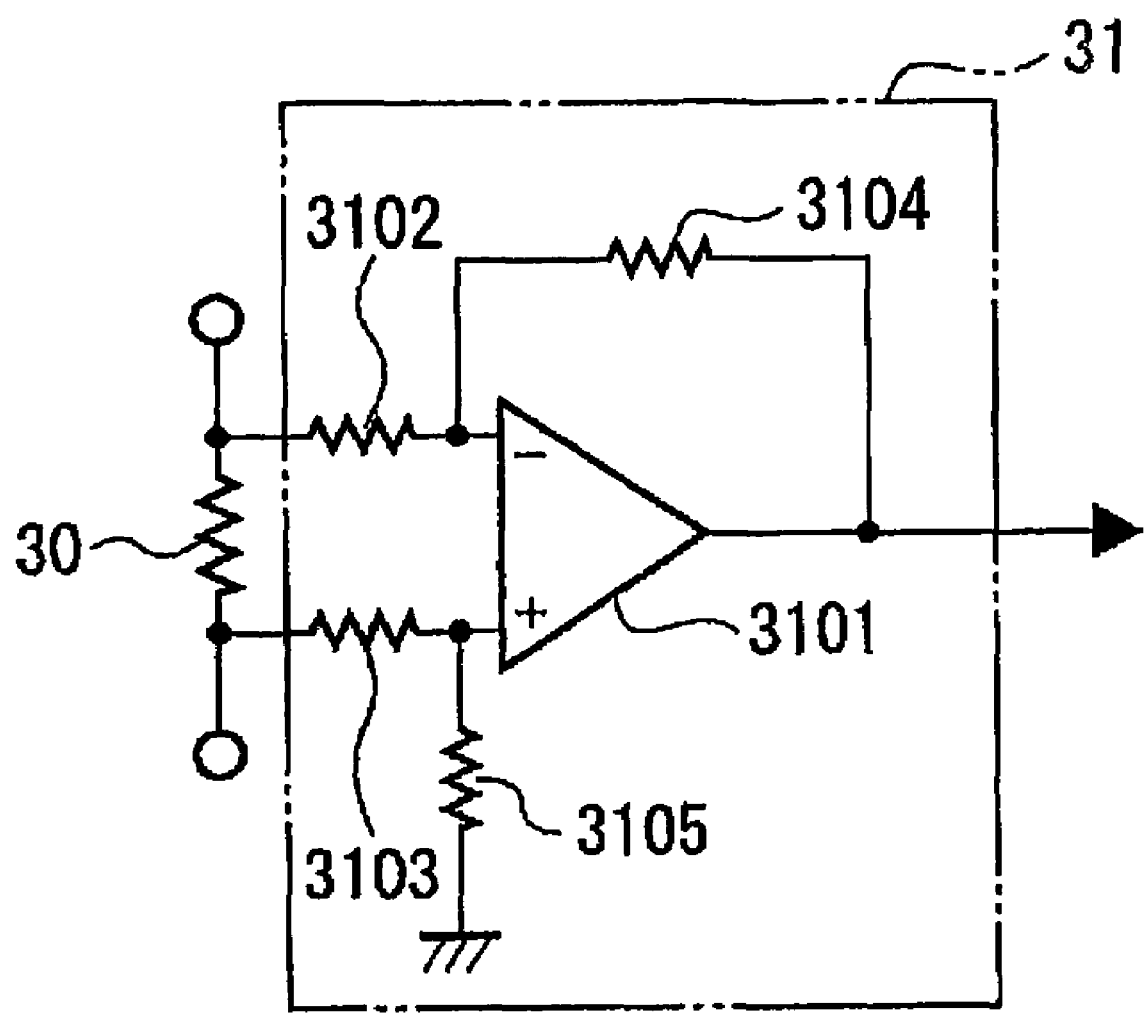
FIG. 2 is a circuit diagram showing a constitution of a buffer of the high frequency heating apparatus according to the embodiment of the invention.

As shown by FIG. 2, the buffer 31 is constituted by including a high input impedance operational amplifier (operational amplifier) 3101, a resistor 3102 interposed between one input end (inverted input end) of the operational amplifier 3101 and the shunt resistor 30, a resistor 3103 interposed between other input end (an inverted input end) of the operational amplifier 3101 and the shunt resistor 30, a resistor 3104 interposed between an output end of the operational amplifier 3101 and the one output end, and a resistor 3105 interposed between the other input end of the operational amplifier 3101 and the ground. In this case, resistance values of the resistor 3102 and the resistor 3103 are made to be equal to each other and resistance values of the resistor 3104 and the resistor 3105 are made to be equal to each other, or resistance ratios thereof are made to be equal to each other (3104/3102=3105/3103) to thereby realize a differential amplifier circuit.

Further, an inverted amplifier circuit may be constituted by omitting the resistor 3105. Further, the resistors 3102, 3104 are operated also as surge input protecting resistors.

The buffer 31 can be packaged even when the shunt resistor 30 is included or excluded. An outward attaching type which does not include the shunt resistor 30 achieves an advantage of capable of selecting a shunt resistor of an optimum resistance value in accordance with a design specification of the high frequency heating apparatus. In contrast thereto, according to an including type including the shunt resistor 30, an optimum one can be selected in accordance with the design specification of the high frequency heating apparatus by preparing ones having various values of shunt resistances. Further, it is also possible to provide a structure capable of setting various values as in FPLA (Field Programmable Logic Array). In any cases, the input current can be detected without using the current transformer as in the prior art. Further, the buffer can be realized by a simple constitution comprising the operational amplifier and the plurality of resistor elements and therefore, low cost formation and small-sized formation are achieved in comparison with the case of using the current transformer. Further, noise generated in the current transformer is not generated.

Next, an explanation will be given of mounting the shunt resistor R30.

Figure 3:
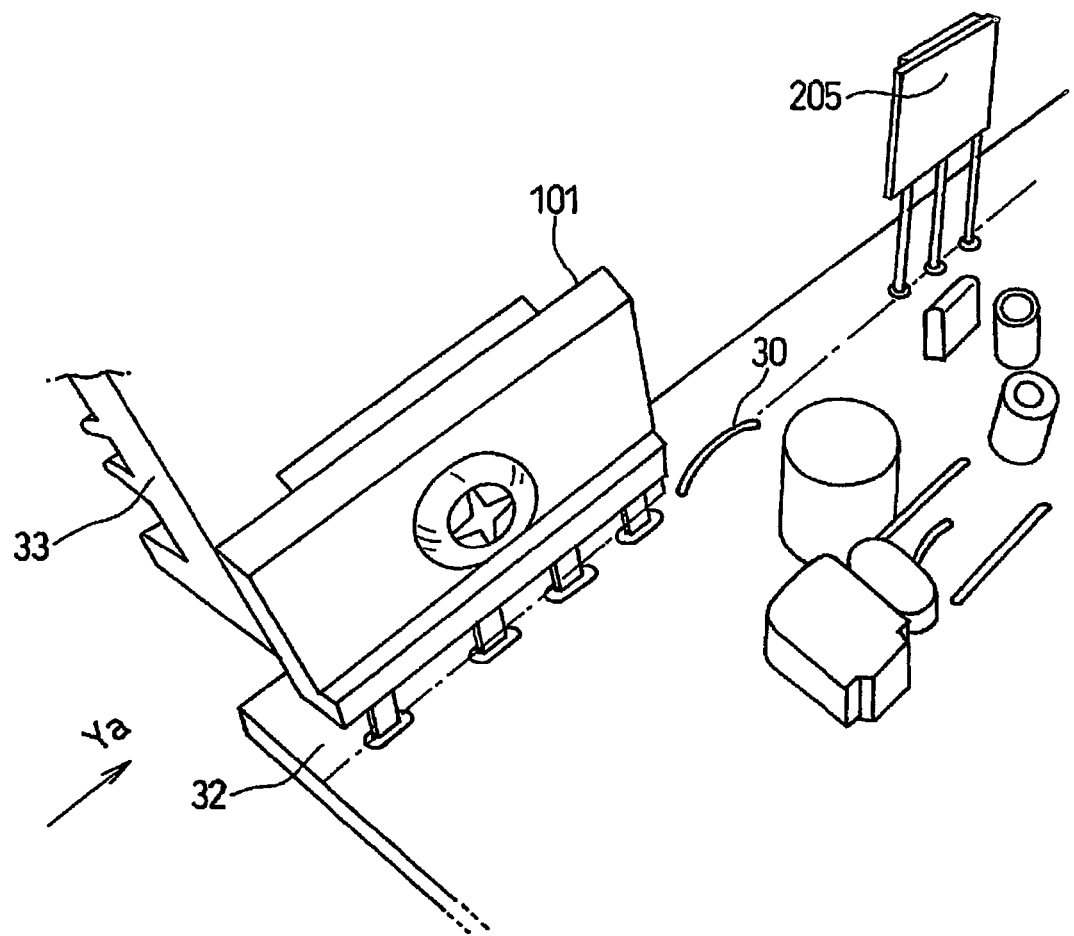
FIG. 3 is a perspective view showing a state of mounting a shunt resistor in the high frequency heating apparatus according to the embodiment of the invention.
Figure 4:
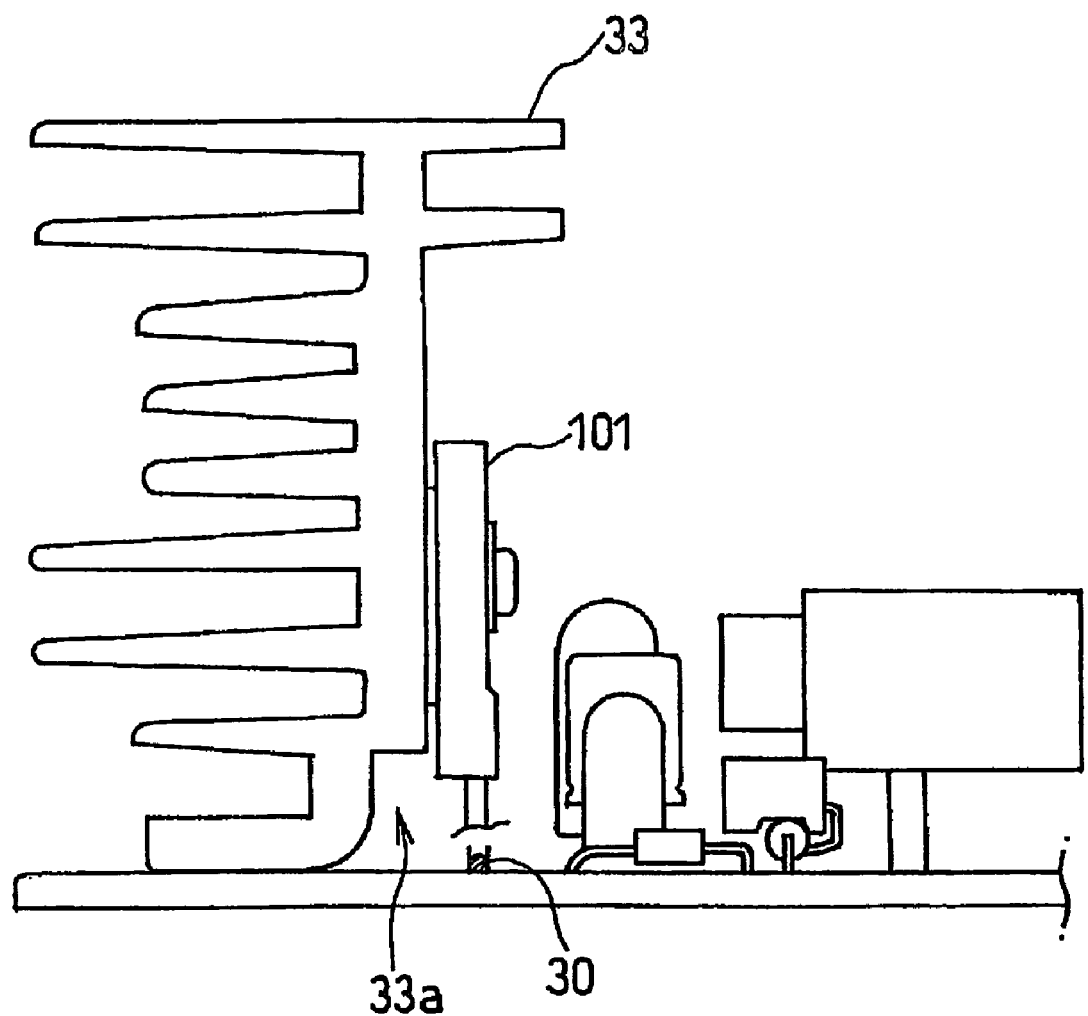
FIG. 4 is a view viewing the mounting state of FIG. 3 from an arrow mark Ya direction.

FIG. 3 is a perspective view showing a state of mounting a portion of a printed board in the high frequency heating apparatus according to the embodiment. Further, FIG. 4 is a view viewing FIG. 3 in an arrow mark Ya direction.

As shown by FIG. 3, the shunt resistor 30 is arranged on a straight line the same as that of the diode bridge (rectifying element) 101 and a semiconductor switching element 205 (although in the drawing, the transistor 203 and the commutating the diode 204 are integrally constituted, the constitution is not limited thereto) above a printed board 32. As shown by FIG. 4, a heat radiating plate 33 is formed with a notched portion 33a for ensuring constant distances between respective terminals of the diode bridge 101 and the semiconductor switching element 205 and the heat radiating plate 33 is made to ensure insulating distances to the diode bridge 101, the semiconductor switching element 205 and the shunt resistor 30. The notched portion 33a is formed along a width direction of the heat radiating plate 33.

By forming the notched portion 33a, the respective terminals of the diode bridge 101, the semiconductor switching element 205 and the shunt resistor 30 can be prevented from being shortcircuited to the heat radiating plate 33 and the shunt resistor 30 can be arranged on the straight line the same as that of the respective terminals of the diode bridge 101 and the semiconductor switching element 205. Incidentally, as dimensions of the notched portion 33a, for example, a height thereof is 6 through 7 mm and a depth thereof is 6 through 7 mm.

Figure 5:
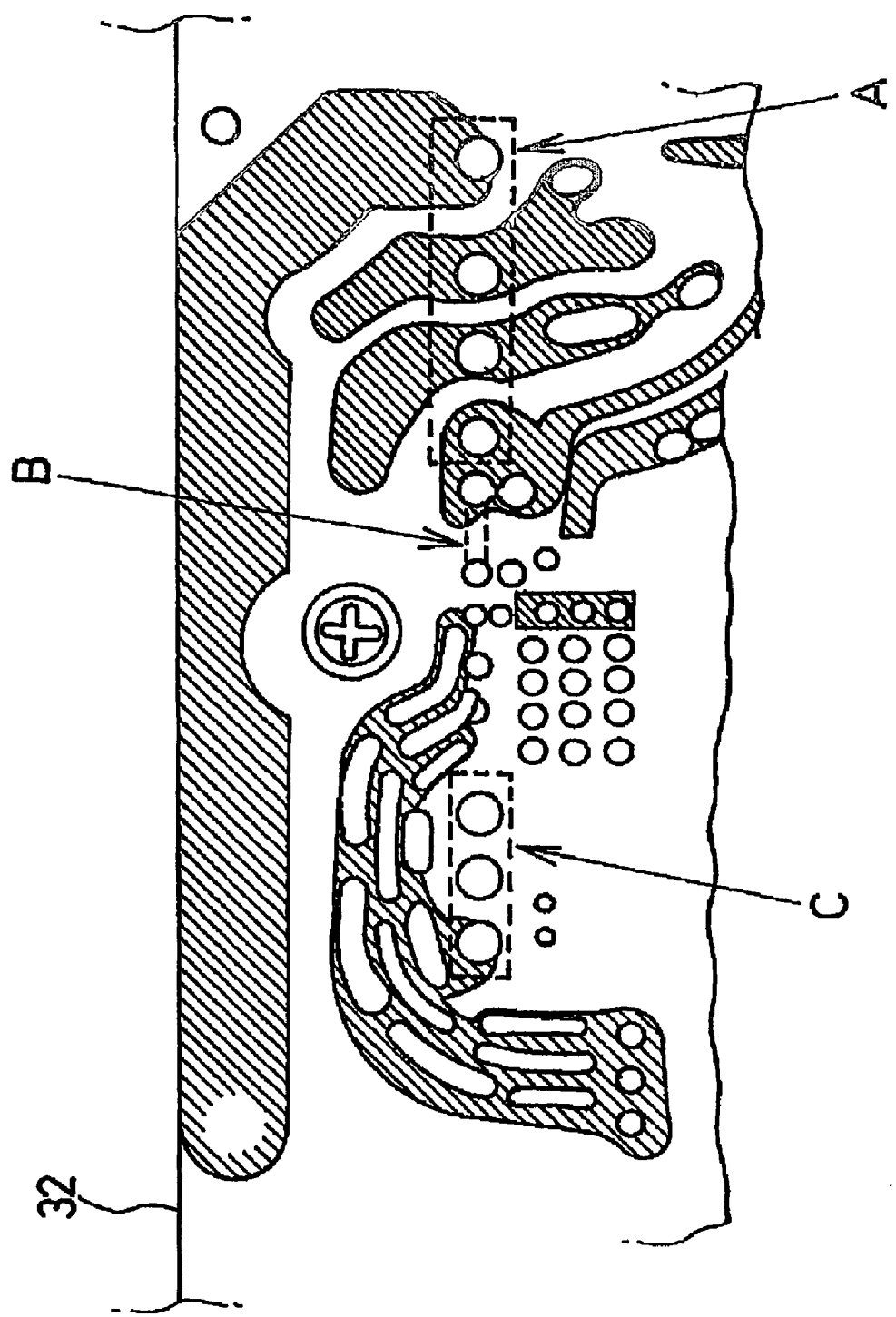
FIG. 5 is a view showing a pattern face of a printed board mounted with the shunt resistor of FIG. 3.

FIG. 5 is a view showing a pattern face of a portion of the printed board 32 for mounting the diode bridge 101, the semiconductor switching element 205 and the shunt resistor 30.

In the drawing, a portion designated by notation "A" is arranged with the diode bridge 101, a portion designated by notation "B" is arranged with the shunt resistor 30 and a portion designated by notation "C" is arranged with the semiconductor switching element 205. By arranging the diode bridge 101, the semiconductor switching element 205 and the shunt resistor 30 on the same straight line above the printed board 32, optimization of a wiring pattern above the printed board 32 is achieved. Further, by the optimization of the wiring pattern, a distance between the diode bridge 101 and the semiconductor switching element 205 and the shunt resistor 30 is shortened and generation of noise from the wiring pattern can be restrained to be low by that amount.

In this way, according to the high frequency heating apparatus of the embodiment, the shunt resistor 30 is interposed in series with a portion capable of measuring an output current of the unidirectional power source portion 1, a voltage generated by the shunt resistor 30 is outputted by the buffer 31 and therefore, in comparison with the case of using the current transformer as in the prior art, a reduction in cost is achieved, further, space saving formation is achieved since the apparatus can be small-sized.

Further, in the buffer 31, the operational amplifier 3101 having the high input impedance is used and therefore, a range of using the shunt resistor 30 is wide and a shunt resistance having an optimum value can be selected in accordance with the design specification of the high frequency heating apparatus.

Further, the insulating distances with regard to the bridge diode 101 and the semiconductor switching element 205 and the shunt resistor 30 are ensured by forming the notched portion 33a in the heat radiating plate 33 and therefore, an accident by short circuit can be prevented before hand. Further, since the shunt resistor 30 and the diode bridge 101 and the semiconductor switching element 205 are arranged on the same straight line above the printed board 32, the optimization of the wiring pattern above the printed board 32 can be achieved, generation of noise from the wiring pattern can be restrained to be low and erroneous operation of the control portion 7 and an influence thereof on a contiguous influence can be minimized. Further, since the bare resistor wire is used for the shunt resistor 30, space saving formation and a reduction in cost can be achieved.

Further, although according to the above-described embodiment, the shunt resistor 30 is arranged on the straight line the same as that of the respective terminals of the diode bridge 101 and the semiconductor switching element 205, the shunt resistor 30 may be arranged at inside of the notched portion 33a. By constituting in this way, further space saving formation can be achieved.

Further, although according to the above-described embodiment, the shunt resistor 30 is constituted by the bare resistor wire in a wire-like shape, the shunt resistor 30 can also be constituted by a bare resistor wire in a plate-like shape.

Further, current detecting means by the shunt resistor 30 and the buffer 31 is applicable not only to the high frequency heating apparatus but also to any apparatus so far as the apparatus is an apparatus having a constitution of detecting a load current and carrying out a control based on a result thereof.

According to the above-described high frequency heating apparatus of the invention, the voltage generated at the shunt resistor is outputted by the buffer by interposing the shunt resistor in series with the portion capable of measuring the output current of the unidirectional power source portion and therefore, in comparison with the case of using the current transformer as in the prior art, a reduction in cost can be achieved and space saving formation can be achieved since the apparatus can be small-sized. Further, erroneous operation of the control portion and an influence thereof on a contiguous apparatus can be excluded by minimizing noise generated in the case of using the current transformer.

Further, since the operational amplifier having the high input impedance is used for the buffer, a width of selecting the shunt resistor can be widened. That is, the shunt resistor can be changed within a range of selecting the width even when there is a change in the design specification of the high frequency heating apparatus and the shunt resistor is changed to a shunt resistor having a different resistance value. Thereby, needs of a customer can be dealt with at low cost.

Further, since the insulating distances with regard to rectifying element and the semiconductor switching element and the shunt resistor are ensured by forming the notched portion in the heat radiating plate, an accident by shortcircuit can be prevented beforehand. Further, since the shunt resistor, the rectifying element and the semiconductor switching element are arranged on the same straight line above the printed board, the optimization of the wiring pattern of the printed board can be achieved, generation of noise from the pattern can be reduced and erroneous operation of the control portion and an influence thereof on an apparatus can be minimized.

Further, since the shunt resistor is arranged at inside of the notched portion of the heat radiating plate, space saving formation and a reduction in cost can be achieved.

Further, since the bare resistor wire is used as the shunt resistor, further space saving formation can be achieved.

Further, according to the method of mounting the shunt resistor of the invention, the shunt resistor and the rectifying element and the semiconductor switching element are arranged on the same straight line above the printed board and therefore, optimization of the pattern above the printed board can be achieved and therefore, space saving formation can be realized. Further, generation of noise from the wiring pattern can be restrained to be low and therefore, erroneous operation of the control portion or an influence thereof on a contiguous apparatus by the noise can be minimized.

Second Embodiment

Figure 10:
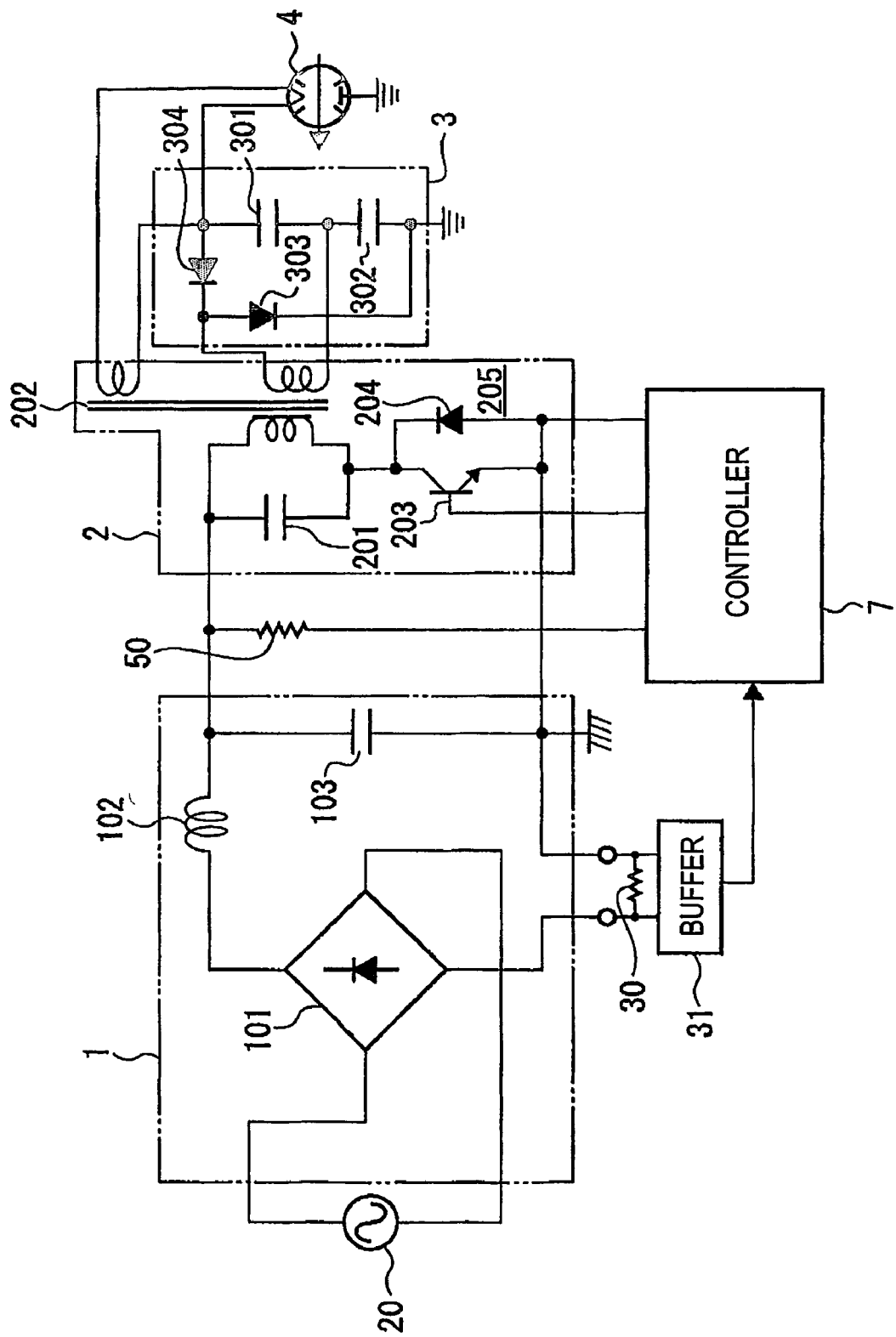
FIG. 10 is a circuit diagram showing a constitution of a high frequency heating apparatus according to a second embodiment of the invention.

A high frequency heating apparatus of FIG. 10 is provided with a cement resistor 50 for lowering a voltage of the direct current output of the unidirectional power source portion 1 to a predetermined voltage between the direct current output end of the unidirectional power source portion 1 and a power source terminal of the control portion 7. In this case, in mounting the cement resistor 50 to a printed board, in order to effectively cool generated heat, the cement resistor 50 is arranged in a direction substantially intersecting with a wind path of cooling wind.

Figure 11:
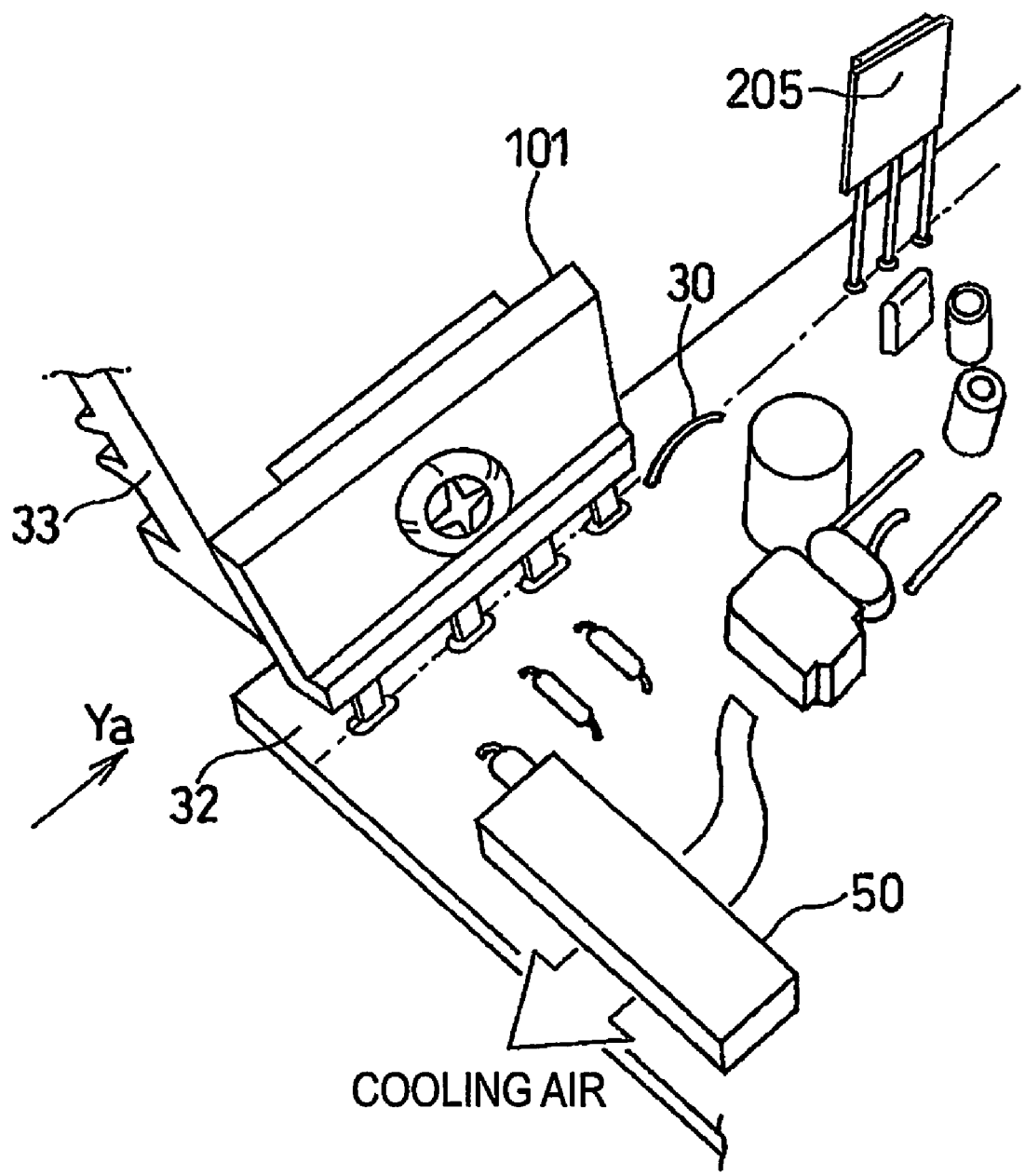
FIG. 11 is a perspective view showing a portion of a printed board mounted with respective parts of the high frequency heating apparatus of FIG. 10.

FIG. 11 is a view showing a state of mounting a portion of the printed board in the high frequency heating apparatus according to the embodiment. Further, FIG. 12 is a view viewing FIG. 11 in an arrow mark Ya direction and on a skewed upper side and FIG. 13 is a view viewing FIG. 11 from the arrow mark Ya direction.

As shown by FIG. 11, the shunt resistor 30 is arranged on a straight line substantially the same as that of the diode bridge 101 and IGBT 205 (constituted by the transistor 203 and the commutating diode 204) attached to the heat radiating plate 33 above the printed board 32. In this case, as shown by FIG. 12, the cooling wind is made to flow from a side of mounting the boost transformer 202 to a side of mounting the cement resistor 50.

Figure 12:
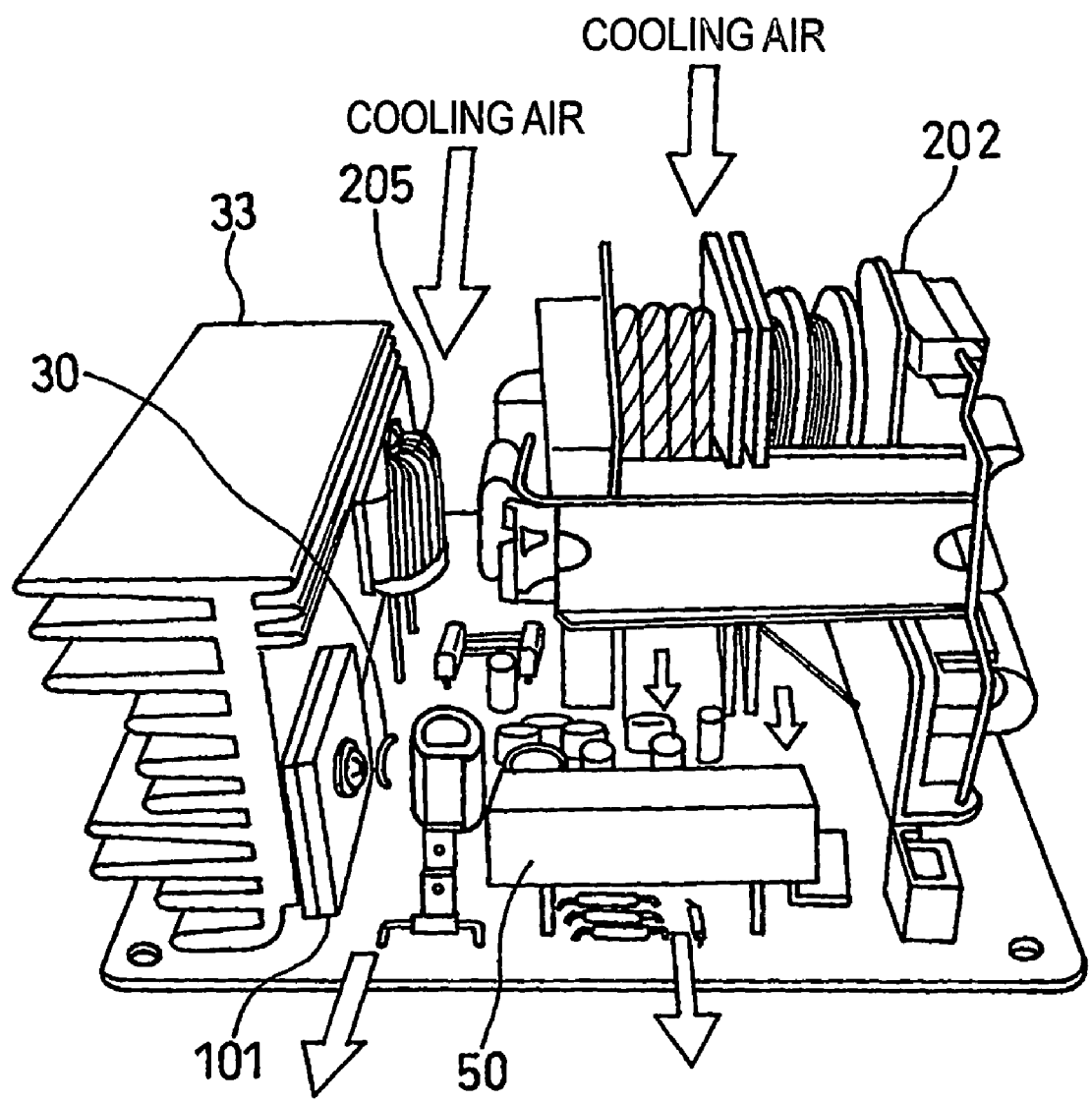
FIG. 12 is a perspective view viewing the printed board of FIG. 11 in an arrow mark Ya direction from a skewed upper side.
Figure 13:
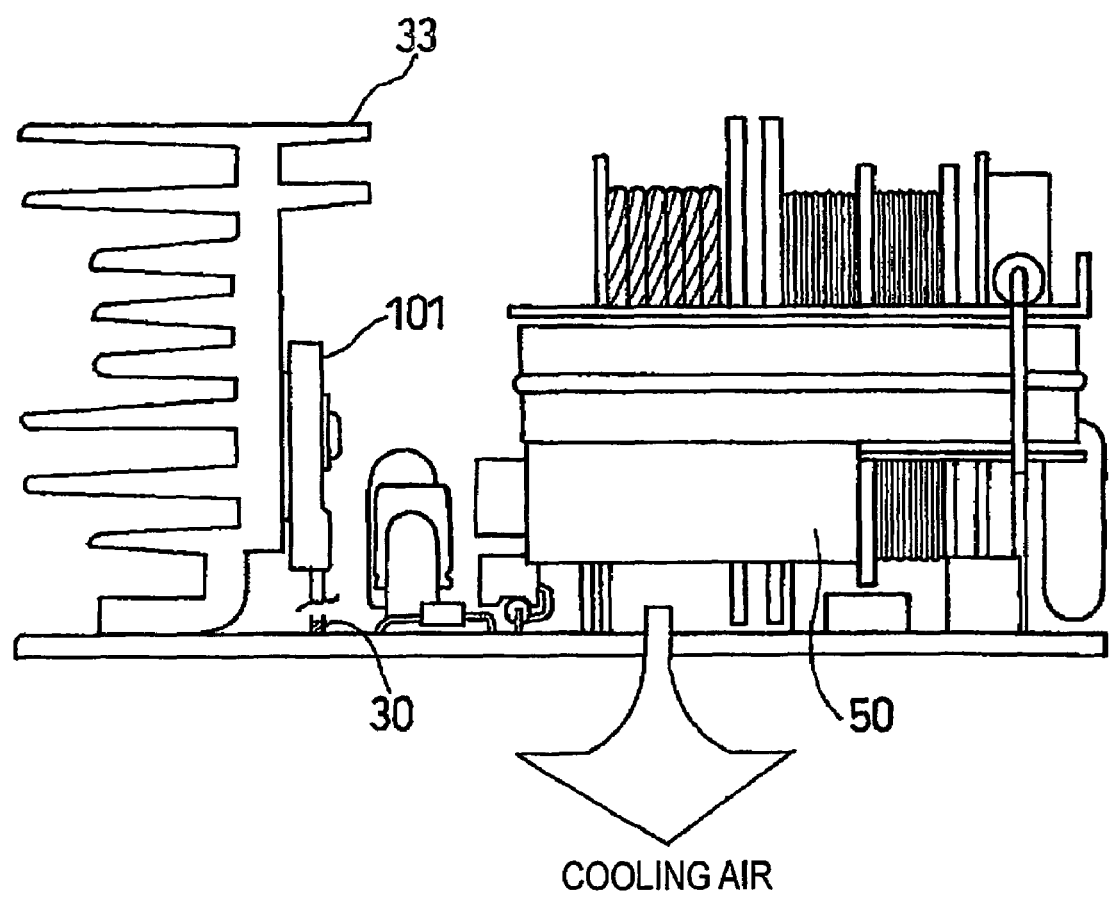
FIG. 13 is a front view viewing the printed board of FIG. 11 in the arrow mark Ya direction.

Further, in FIG. 12, when a description is generally given to a layout of arranging principal parts, there is constituted a mode of mounting mainly high voltage parts to an upstream side of wind (depth side of paper face) of the boost transformer 202 and mounting mainly control circuit parts and low current circuit parts to a downstream side of wind (a side of paper face) of the boost transformer 202.

Further, although a portion of the cooling wind flows in a space between the heat radiating plate 33 and the boost transformer 202, since the shut resistor 30 is mounted above the printed board 32 along above the wind path of the space and therefore, almost all of the cooling wind passes therethrough without being hampered by the shunt resistor 30. That is, a factor of hampering the cooling wind by the shunt resistor 30 is minimized.

Further, even when the shunt resistor 30 is arranged along above the wind path, depending on a shape thereof, there is a possibility of enlarging an area thereof to which the cooling wind is blown and therefore, in such a case, the shunt resistor 30 may be arranged in a direction minimizing the area to which the cooling wind is blown.

Further, also as shown by FIG. 13, although the cooling wind passing the boost transformer 202 by ducking to a lower side of the boost transformer 202 reaches the cement resistor 50 on the downstream side of wind, since the cement resistor 50 is mounted in the direction substantially intersecting with the wind path of the cooling wind, the cooling wind is blown to an entire face of a side face of the cement resistor 50. As a result, the cement resistor 50 is efficiently cooled.

Further, there is a portion of the cooling wind passing an upper side of the boost transformer 202 and the cooling wind is blown from an upper side of the side face of the cement resistor 50 to an entire region of an upper face thereof. Therefore, by arranging the cement resistor 50 in the direction substantially intersecting with the wind path of the cooling wind, the entire region of the upper face can be cooled uniformly and firmly.

Further, even when the cement resistor 50 is arranged in the direction substantially intersecting with the wind path, depending on the shape, there is a possibility of reducing the area to which the cooling wind is blown and therefore, in such a case the cement resistor 50 may be arranged in a direction maximizing the area to which the cooling wind is blown.

In this way, according to the high frequency heating apparatus of the embodiment, since the shunt resistor 30 used for measuring the output current of the unidirectional power source portion 1 is arranged above the printed board 32 along the wind path of the cooling wind flowing above the printed board 32, a rate of hampering flow of the cooling wind can be minimized and an increase in the cooling efficiency can be achieved.

Further, since the cement resistor 50 is arranged in the direction substantially intersecting with the wind path of the cooling wind, the cement resistor 50 generating heat can efficiency be cooled.

Further, by the constitution of arranging the shunt resistor 30 and the cement resistor 50, efficient cooling can be carried out even when space saving formation is constituted in accordance with small-sized formation of the main body of the high frequency heating apparatus.

Further, arrangement of the shunt resistor 30 along the wind path of the cooling wind flowing above the printed board 32 is effective in view of the cooling efficiency including cooling of the cement resistor 50 when the cement resistor 50 is obliged to arrange on the downstream side of wind of the shunt resistor 30.

Further, when there is a part which generates heat by conducting electricity other than the cement resistor 50, the path may similarly be arranged.

Figure 14:
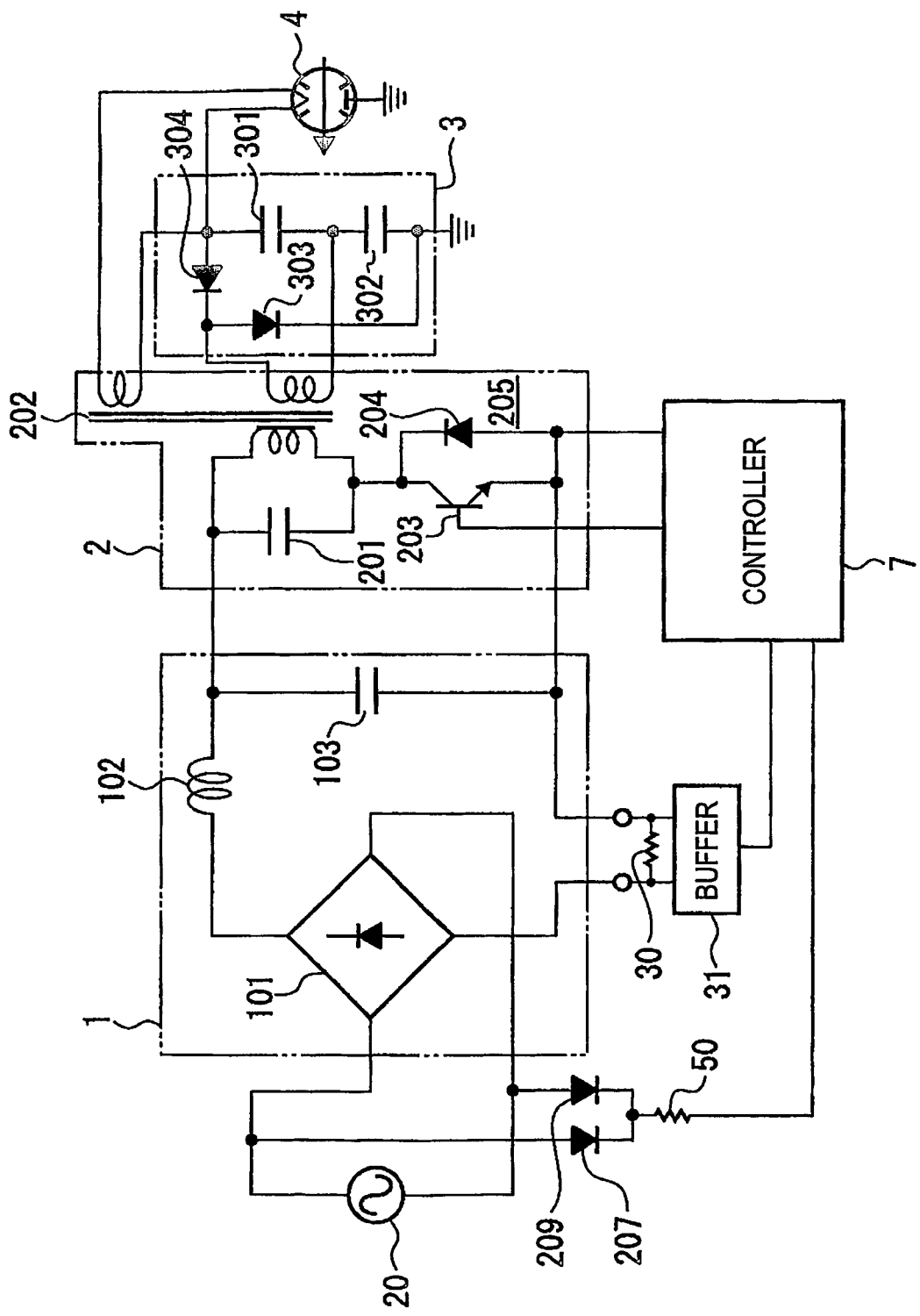
FIG. 14 is a circuit diagram showing a modified example of the high frequency heating apparatus according to the second embodiment of the invention.

Further, although according to the above-described embodiment, as shown by FIG. 10, the cement resistor 50 is interposed between the direct current output end of the unidirectional power source portion 1 and the power source terminal portion of the control portion 7, in place of the constitution, as shown by FIG. 14, even when the alternating current power source is rectified by respectively interposing diodes 207, 209 at both ends of the commercial power source 20 and thereafter, the cement resistor 50 is interposed between a contact point of the respective diodes 207, 209 and the power source terminal portion of the control portion 7, similar effect can naturally be achieved.

As described above, according to the high frequency heating apparatus of the invention, the shunt resistor used for measuring the output current of the unidirectional power source portion is arranged above the printed board along the wind path of the cooling wind showing above the printed board and therefore, an increase in the cooling efficiency can be achieved by minimizing the rate of hampering flow of the cooling wind.

Further, the cement resistor accompanied by heat generation is arranged in the direction substantially intersecting with the wind path of the cooling wind and therefore, the cement resistor is efficiently cooled.

Therefore, even when a density of mounting electric parts arranged above the printed board is increased by space saving formation accompanied by small-sized formation of the main body of the high frequency heating apparatus, parts generating heat can efficiently be cooled. In other words, the space saving formation can be constituted and the small-sized formation of the main body of the high frequency heating apparatus can be realized.

Third Embodiment

An explanation will be given by comparing a constitution which is not provided with a conductive through hole, an eyelet constitution and a constitution of soldering a both face conductive portion with regard to an improvement in current-voltage converting accuracy and an increase in current control accuracy by reducing a change in a resistance value of the shunt resistor having a temperature dependency and also reducing a change in the resistance value by a deterioration thereof simultaneously therewith.

Figure 6:
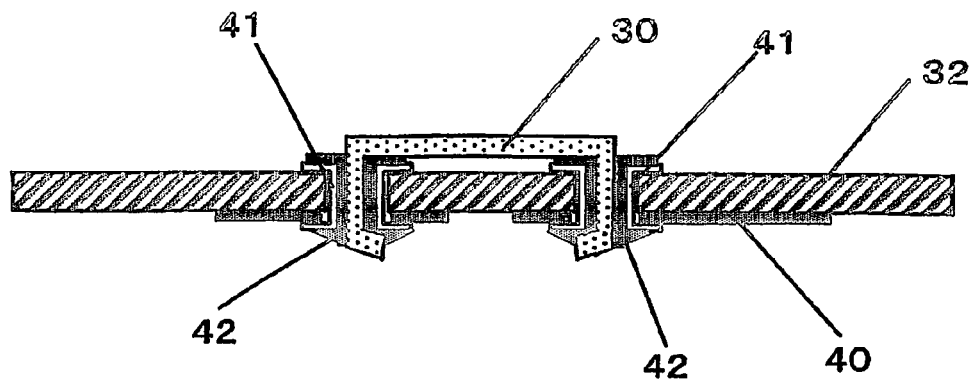
FIG. 6 is a sectional view showing a constitution of an eyelet of the printed board mounted with the shunt resistor of FIG. 3.
Figure 7:
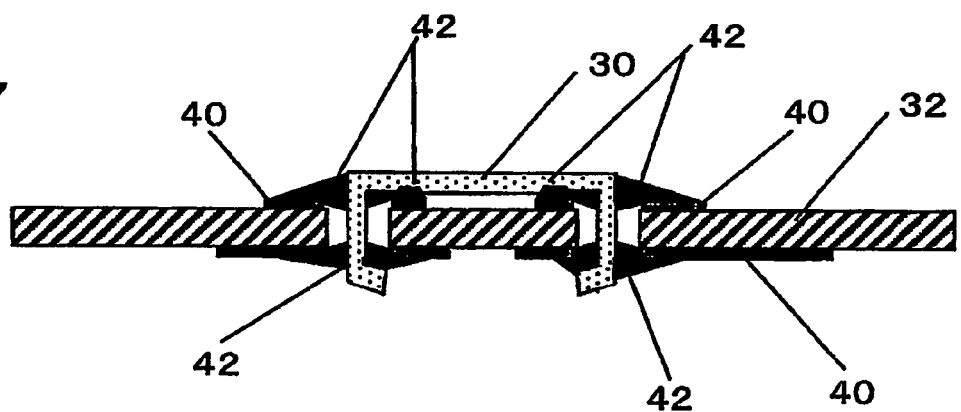
FIG. 7 is a sectional view showing a constitution of soldering a both face conducting portion of the printed board mounted with the shunt resistor of FIG. 3.
Figure 8:
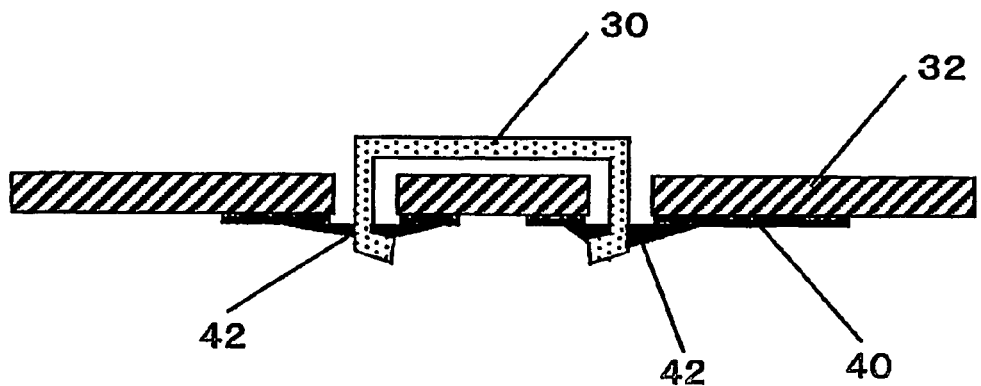
FIG. 8 is a sectional view showing a constitution in which a conductive through hole is not provided of the printed board mounted with the shunt resistor of FIG. 3.

FIG. 8 is a sectional view showing a constitution which is not provided with a conductive through hole of the printed board mounted with the shunt resistor. FIG. 6 is a sectional view showing an eyelet constitution of the printed board mounted with the shunt resistor. FIG. 7 is a sectional view showing a constitution of soldering a both face conductive portion of the printed board mounted with the shunt resistor.

According to the constitution which does not use an eyelet shown in FIG. 8, a heat capacity added to the shunt resistor 30 is constituted only by a pattern 40 and solder 42 adhered thereto provided on one face of the printed board 32 and heat radiating performance is poor. Therefore, a change in a resistance value produced by self heat generation of the shunt resistor 30 is increased and therefore, expected current detecting accuracy cannot be achieved.

In comparison with FIG. 8, according to the constitutions of FIG. 6 and FIG. 7, an amount of adhering the solder 42 is significantly increased in addition to an increase in an area of the pattern 40 and therefore, heat radiating performance of the shunt resistor 30 is promoted and the current detecting accuracy is promoted. Particularly, in the case of using an eyelet 41 of FIG. 6, the effect becomes significant.

Further, when the comparison is made from a view point of an effective length and the current detecting accuracy of the shunt resistor 30, according to the constitution of FIG. 8, a hole of the printed board 32 is provided to be slightly larger than a diameter of the shunt resistor 30 for easiness of mounting. A degree of fixedly attaching the shunt resistor 30 to the printed board 32 is increased and play in soldering is restrained by being clinched as shown by the drawing and therefore, effective length accuracy can be ensured to some degree.

According to the constitution of FIG. 6, there is used the eyelet 41 for ensuring accuracy of mounting the shunt resistor 30 to the printed board 32 and therefore, a distance between flanges of the eyelet 41 formed at an upper face of the drawing becomes the effective length of the shunt resistor 30 and in comparison with FIG. 8, the current detecting accuracy is much excellent.

According to the constitution of FIG. 7, a both face pattern board is used in place of using the eyelet 41 in the printed board 32 as in the constitution of FIG. 6, the pattern 40 is formed also at a surrounding of the through hole on a side of a face of inserting the shunt resistor 30 and the shunt resistor 30 and the pattern 40 at the surrounding of the through hole are electrically conducted in the solder. By soldering the both face conductive portion, the heat capacity of the shunt resistor is added with a heat capacity of the conductive through hole, the conductive portion and the solder and heat radiating performance of the shunt resistor is promoted.

Similar to FIG. 6, according to the constitution of FIG. 7, a distance between end faces of the pattern 40 formed accurately at the upper face of the drawing becomes the effective length and in comparison with FIG. 8, the current is accurately detected.

Further, other than forming the conductive through hole on the board by the eyelet, there is a through hole board (not illustrated) using a conductive member at a through hole of the board. For example, in fabricating a copper through hole board, the fabrication is carried out by forming a photoresist at a surface of the board having a copper-plated through hole and successively being processed by exposing, developing, etching and a resist exfoliating steps via the photomask.

Even when the through hole is used, the through hole naturally contributes to promotion of the effective length accuracy of the shunt resistor and promotes the current detecting accuracy.

As is shown by FIG. 6 and FIG. 7, mounting of the shunt resistor 30 is constituted to insert the shunt resistor 30 which is the bare resistor wire into the conductive through hole of the printed board 32 and thereafter fixedly attaching the shunt resistor 30 to the board by being clinched and therefore, the shunt resistor 30 is not floated up from the printed board in soldering.

That is, also the clinching operation contributes to promote the elective length accuracy of the shunt resistor 30 and promotes the current detecting accuracy.

Although the direction of clinching the shunt resistor 30 shown in FIG. 6 and FIG. 7 is in an inner direction and by clinching the shunt resistor 30 in the direction to envelop an interval between the holes of the printed board 32, the effective length accuracy of the shunt resistor 30 is generally achieved, the clinching direction is not limited to the inner direction.

Further, mechanical strength of the hole of the printed board 32 is increased by the eyelet 41 shown in FIG. 6 or the both face patterns 40 shown in FIG. 7 and a crack by the clinching operation of the shunt resistor 30 can be prevented.

As has been described above, the high frequency heating apparatus according to the invention not only reduces the change in the resistance value of the shunt resistor having the temperature dependency but also the change in the resistance value by deteriorating the shunt resistor to thereby improve the current-voltage converting accuracy and promote the current control accuracy and therefore, the apparatus is applicable also to use of a high frequency generating apparatus or the like.

As described above, according to the high frequency heating apparatus of the invention, the heat capacity of the eyelet is added with the heat capacity of the conductive through hole and therefore, the heat radiating performance of the shunt resistor is promoted and a temperature rise by power loss of the shunt resistor can be alleviated. Therefore, not only the change in the resistance value of the shunt resistor having the temperature dependency is reduced but also the change in the resistance value by deteriorating the shunt resistor is reduced.

Further, relative positional accuracy of the conductive through hole is much excellent, a dispersion in the effective length of the shunt resistor amount thereto becomes smaller than that in the case in which the conductive through hole is not used and therefore, the current-voltage converting accuracy is much improved in addition to the former and the control accuracy can be promoted.

Further, according to the method of mounting the shunt resistor of the invention, a positional relationship between the shunt resistor and the conductive through hole is accurately maintained when the shunt resistor and the conductive through hole are connected by soldering or the like and therefore, the effective length of the shunt resistor becomes more accurate than that in the mounting method in which the shunt resistor is not clinched. Therefore, the current-voltage converting accuracy can significantly be improved and the current control accuracy can be prevented.

Further, the mechanical strength of the hole of the board is promoted by the conductive through hole and the crack of the board in clinching operation can be prevented.

Fourth Embodiment

According to the above-describe high frequency heating apparatus, the shunt resistor is used for detecting the input current and according to a high frequency heating apparatus using a constant voltage diode (zener diode) for generating a reference value for controlling the input current constant, since the zener diode is provided with a temperature characteristic, the above-described reference voltage (and therefore, the input current) is increased by a rise in an atmospheric temperature (temperature at the surrounding of the circuit) in accordance with elapse of a cooking time period. With regard to the increase in the reference voltage, the shunt resistor having a stable temperature characteristic is generally used and therefore, there poses a problem that the input current is not controlled constant but is increased by following the reference voltage.

Further, a similar problem is posed also with regard to the current transformer since the temperature characteristic is uniquely determined at a design stage.

Figure 19:
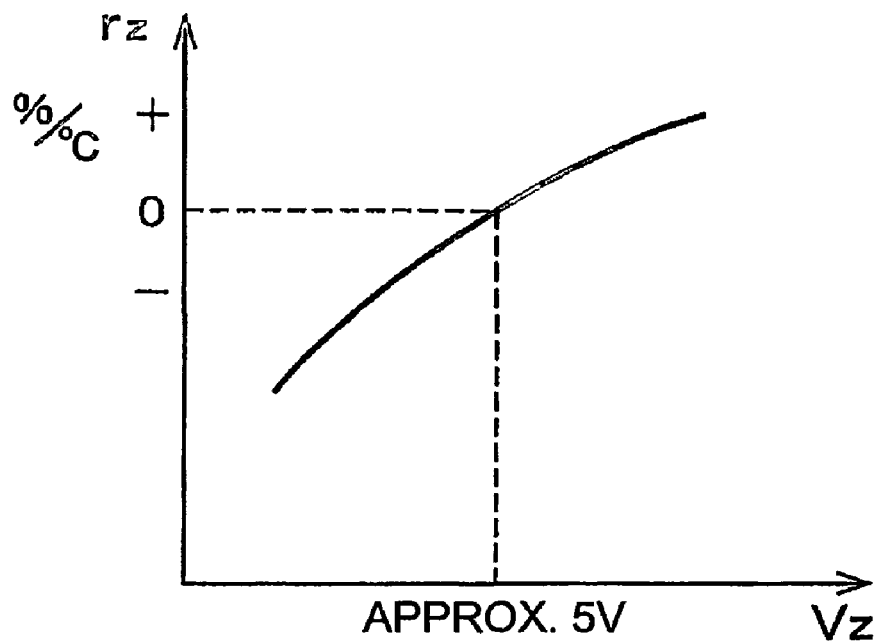
FIG. 19 is a diagram showing an example of a temperature characteristic of a zener diode.

Here, FIG. 19 is a diagram showing an example of a zener voltage temperature coefficient. In the drawing, the abscissa designates a zener voltage (Vz) and the ordinate designates a zener voltage temperature coefficient $\gamma z$ (%/° C.). In this example, the zener voltage temperature coefficient γz is changed in directions centering on about 5V. Further, as is well known, the zener voltage Vz is changed by a change in a temperature of a chip junction portion and a change rate thereof, that is, the zener voltage temperature coefficient γz can be represented by the following equation.

$$\gamma z = \Delta Vz / \Delta Tj$$

where ΔVz: an amount of a change in the zener voltage, ΔTj: an amount of a change in a junction portion temperature (self heat generation temperature+surrounding temperature).

An actual zener voltage temperature coefficient γz (surrounding temperature T1 through T2) can generally be calculated by the following equation.

$$\gamma z = [(Vz(T2)-Vz(T1))/(Vz(25° C.)|T2-T1|)] \times 100$$

Figure 20:
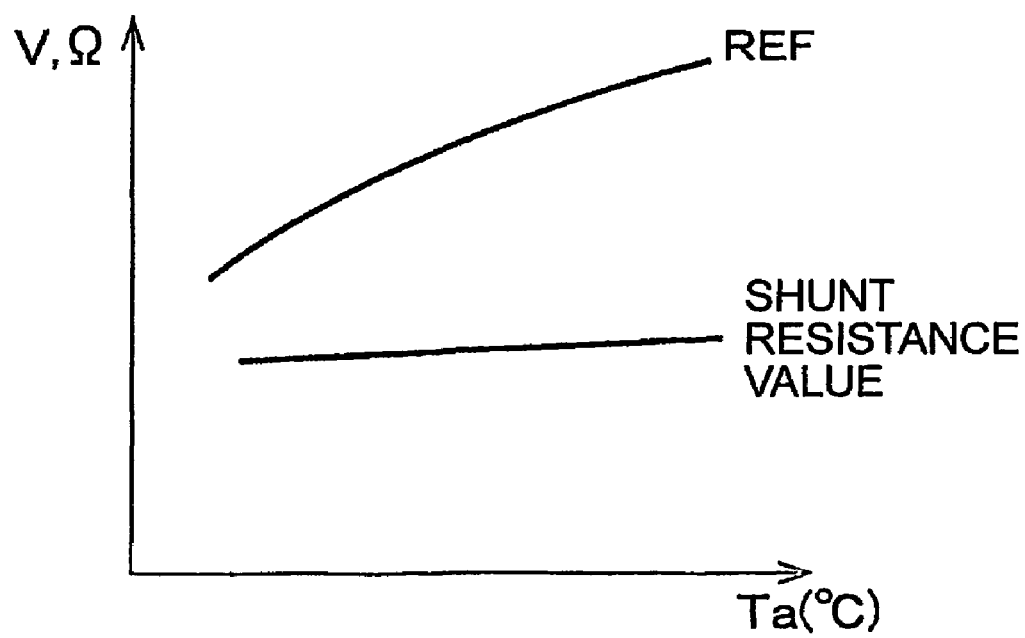
FIG. 20 is a diagram showing a relationship between a reference value REF and the value of the shunt resistor in the high frequency heating apparatus.

Further, FIG. 20 is a diagram showing a relationship between the reference value REF and the shunt resistance value in accordance with a change in the temperature. In the drawing, the abscissa designates an atmospheric temperature Ta (° C.) and the ordinate designates a voltage and a resistance value. Although the higher the atmospheric temperature Ta, the more increased is the reference value REF in accordance with a rise in the zener voltage, as described above, the value of the shunt resistor is substantially constant by using the shunt resistor having a stable temperature characteristic.

Therefore, when the reference value REF is increased in accordance with a rise of the atmospheric temperature Ta, since the value of the shunt resistor is substantially constant as described above, the input current Iin is increased by following the increase in the reference value and it is difficult to control the input current constant.

Figure 21:
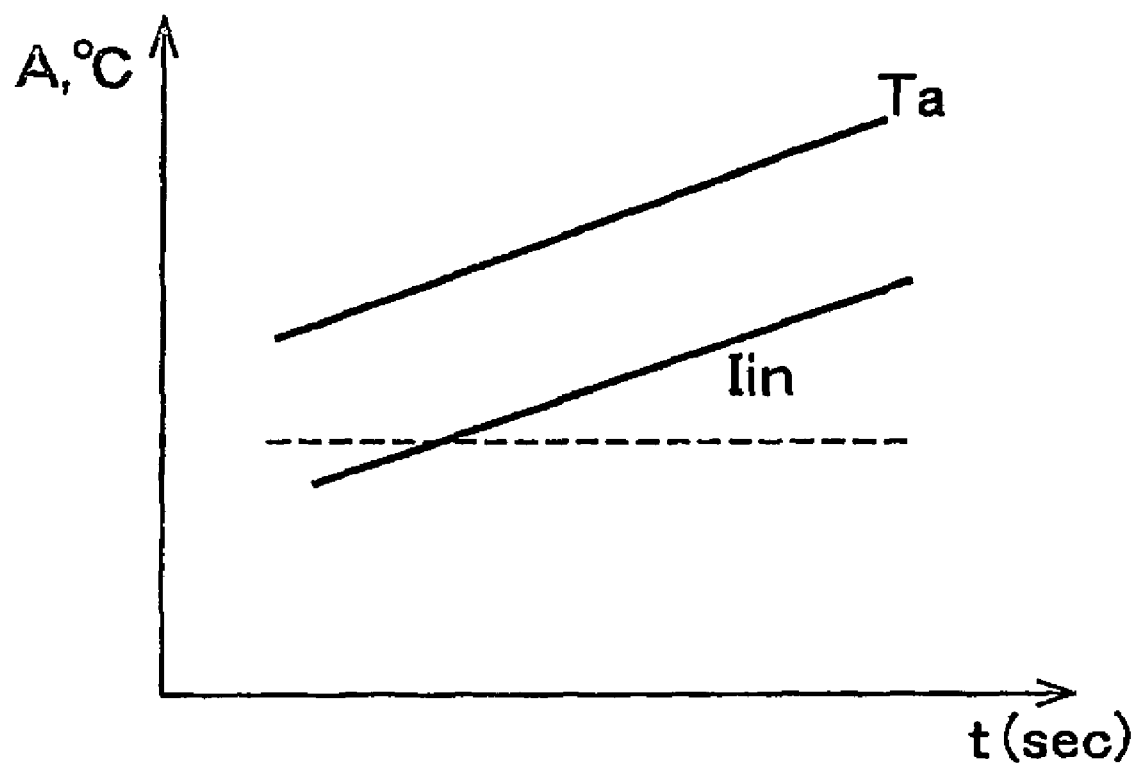
FIG. 21 is a diagram showing a relationship between the atmospheric temperature Ta and the input current Iin according to the high frequency heating apparatus.

Further, FIG. 21 is a diagram showing a relationship between atmospheric temperature Ta and the input current Iin. In the drawing, the abscissa designates an elapse time period t (sec) and the ordinates designates the temperature (° C.) and the current (A).

Although it is ideal that the input current Iin stays to be constant even when the atmospheric temperature Ta is changed, since the reference value REF is increased in accordance with the rise in the atmospheric temperature as described above, the input current Iin is increased y following the atmospheric temperature Ta as shown by a bold line. Further, a semiconductor element, a magnetron or the like may be destructed by an abnormal rise in the temperature by increasing loss thereof.

A detailed explanation will be given of a fourth embodiment of the invention in reference to the drawings as follows.

Figure 15:
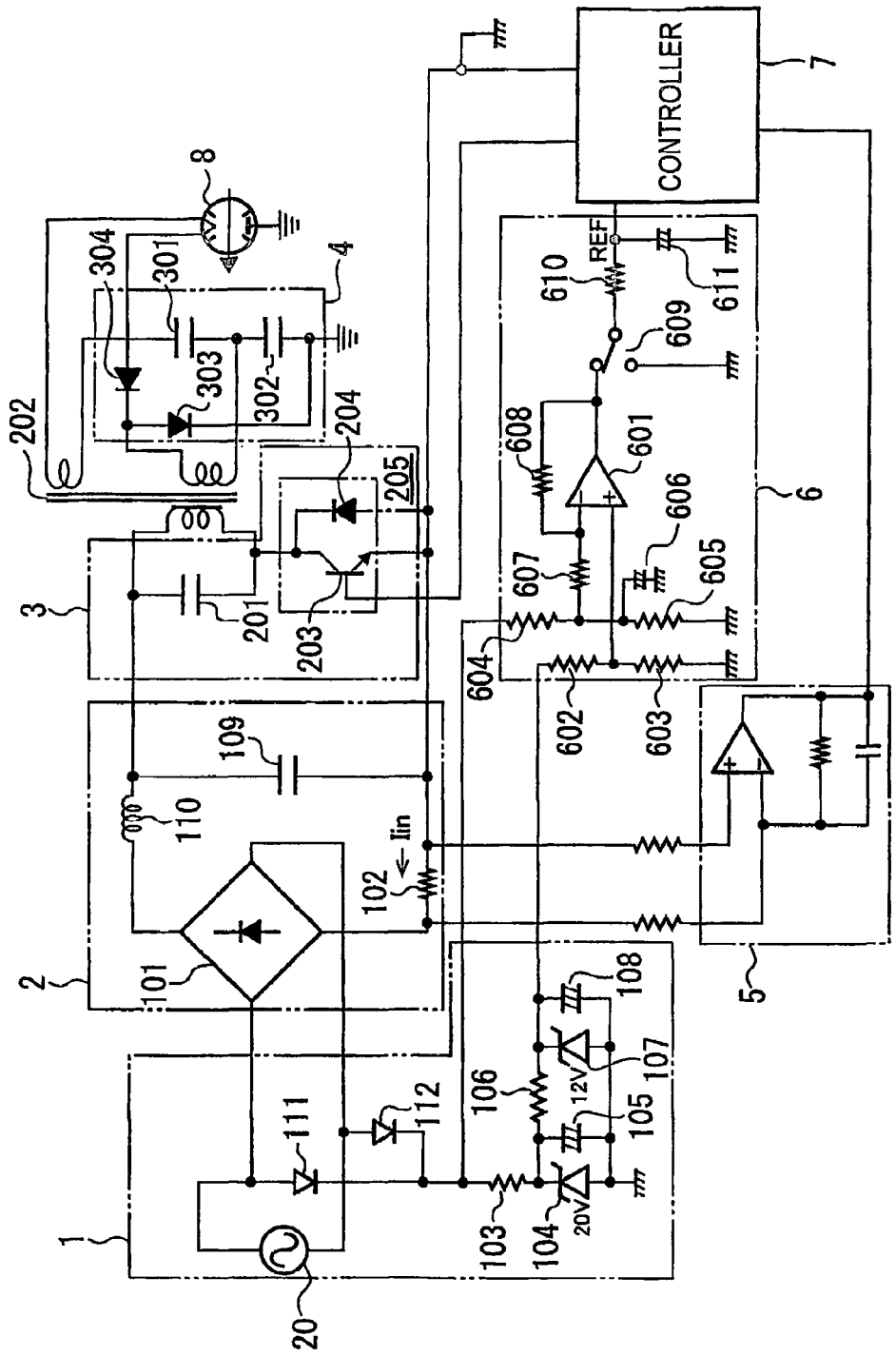
FIG. 15 is a circuit diagram showing a constitution of a high frequency heating apparatus according to a fourth embodiment of the invention.

FIG. 15 is a circuit diagram showing a constitution of a high frequency heating apparatus according to an embodiment of the invention.

In FIG. 15, the high frequency heating apparatus according to the embodiment is provided with the power source portion 1, a rectifying and smoothing portion 2, the inverter portion 3, the high voltage rectifying circuit 4, the magnetron 8, an input current detecting portion 5 for detecting the input current Iin from a shunt resistor 102 connected to the power source portion 1, a reference value generating portion 6 for generating a reference value for detecting an error in the input current Iin, and the control portion 7 for controlling the inverter portion 3 based on the error of the input current Iin relative to the reference value above a printed board, not illustrated.

The rectifying and smoothing portion 2 is provided with the diode bridge 101 for subjecting the alternating current power source from the commercial power source 20 to full-wave rectification, the shunt resistor 102 interposed in series with the negative output side terminal of the diode bridge 101 for detecting the input current Iin, the choke coil 110 and a smoothing capacitor 109 for filtering and generates a direct current power source for operating the inverter portion 3.

The power source portion 1 is provided with rectifying diodes 111, 112, a cement resistor 103 and a zener diode 104, an aluminum electrolytic condenser 105, a resistor 106 for generating a direct current voltage provided to the reference value generating portion 6, a zener diode 107 and a capacitor 108. Further, according to the invention, a circuit portion for generating a direct current power source (20V, 12V) by including the zener diodes 104, 107 in the above-described power source portion 1 is referred to as a direct current power source portion. Further, the direct current power source portion may be formed as a board separated from a main board including the inverter portion to supply the direct current power source to the reference value generating portion above the main board.

The cement resistor 103 and the zener diode 104 and the aluminum electrolytic condenser 105 are connected in series. One end of the resistor 106 is connected to a side of a cathode of the zener diode 104 and other end thereof is connected to a side of a cathode of the zener diode 107. A cathode of the zener diode 107 is connected to the other end of the above-described resistor 106 and an anode thereof is grounded along with an anode of the zener diode 104. The capacitor 108 is connected in parallel with the zener diode 107.

The inverter portion 103 is constituted by the resonant capacitor 201, the transistor 203 and the commutating diode 204. The transistor 204 is operated to switch by the switching control signal of 20 through 50 kHz provided from the control portion 7. Thereby, the high frequency voltage is generated at the primary winding of the boost transformer 202. Further, the transistor 203 is referred to as IGBT (Insulated Gate Bipolar Transistor) 205 by being integrally formed mainly with the commutating diode 204. Although the IGBT 205 is used in the application, a similar effect is achieved by using other semiconductor switching element.

The high voltage rectifying element 4 is constituted by the capacitors 301 and 302 and the diodes 303 and 304 and generates the high voltage direct current voltage by subjecting the voltage generated at the secondary winding of the boost transformer 202 to both-wave multiplying voltage rectification to be applied to the magnetron 8. The magnetron 8 is also applied with the alternating current voltage for the heater from the heater winding of the boost transformer 202. The magnetron 8 is brought into the emittable state by heating the cathode by applying the alternating current voltage for the heater and when the high direct current voltage is applied under the state, the electromagnetic energy is generated.

The reference value generating portion 6 is provided with resistors 602 and 603 for dividing a voltage inputted from the power source portion 1 to apply to an uninverted input end or an operational amplifier 601, resistors 604 and 605 and an aluminum electrolytic condenser 606 for outputting a direct current output of the power source portion 1, resistors 607, 608 for determining an operating constant of the operational amplifier 601, a switch 609 for outputting an output of the operational amplifier 601 and an integrating circuit comprising a resistor 610 and a capacitor 611 for shaping a waveform of output of the operational amplifier 601 outputted by the switch 609. A switching time period of the switch 609 is changed by a duty ratio by setting a high frequency output.

The control portion 7 compares the reference value REF from the reference value generating portion 6 and the input current Iin detected by the input current detecting portion 5 to control such that reference value REF=Iin×R. Further, the transistor 203 of the inverter portion 3 is controlled to ON/OFF by a signal from the control portion 7. In this way, the commercial power source 20 is converted into the unidirectional voltage by the rectifying and smoothing portion 2, the unidirectional voltage is converted into the high frequency voltage by the inverter portion 3 to be boosted up by the boost transformer 202 and thereafter converted into the high direct current voltage by subjecting the boosted-up voltage to multiplying voltage rectification again by the high voltage rectifying circuit 4 to drive the magnetron 8.

Here, a characteristic constitution of the invention resides in that the shunt resistor 102 of the rectifying and smoothing portion 2 is provided with a temperature characteristic approximated to a temperature characteristic of the zener diode 107 and when the reference value REF is increased by increasing the zener voltage of the zener diode 107 by a rise in the atmospheric temperature, the resistance value R of the shunt resistor 102 is also increased by being approximated thereto. Therefore, even when the atmospheric temperature is elevated, an accurate high frequency resonating control is carried out for the magnetron 8.

Figure 16:
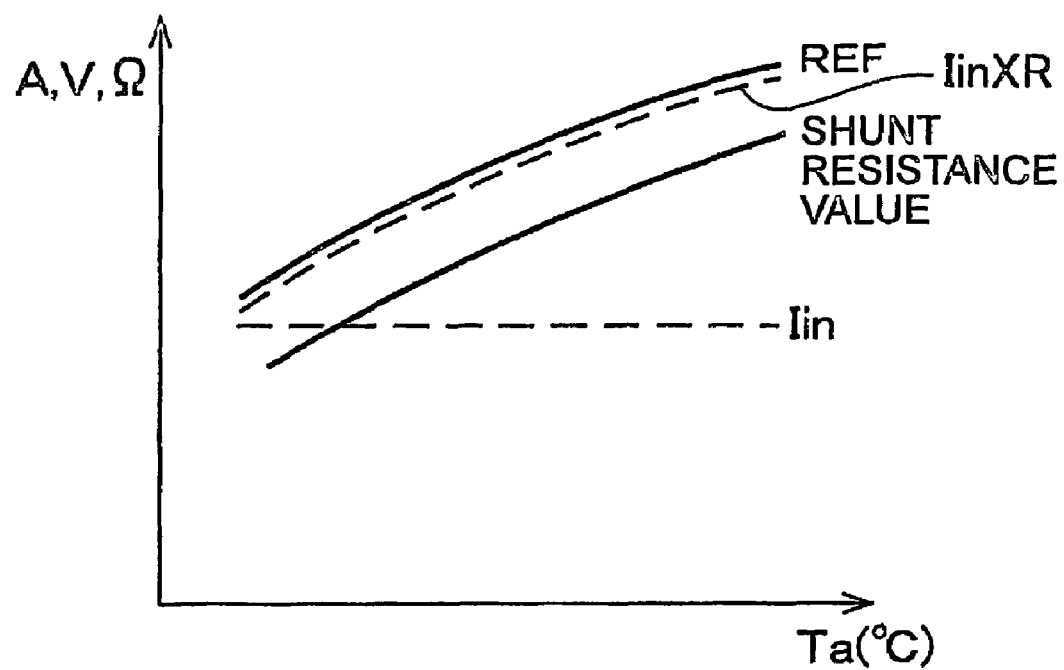
FIG. 16 is a diagram showing a relationship between a reference value REF and a value of a shunt resistance in the high frequency apparatus of FIG. 15.
Figure 17:
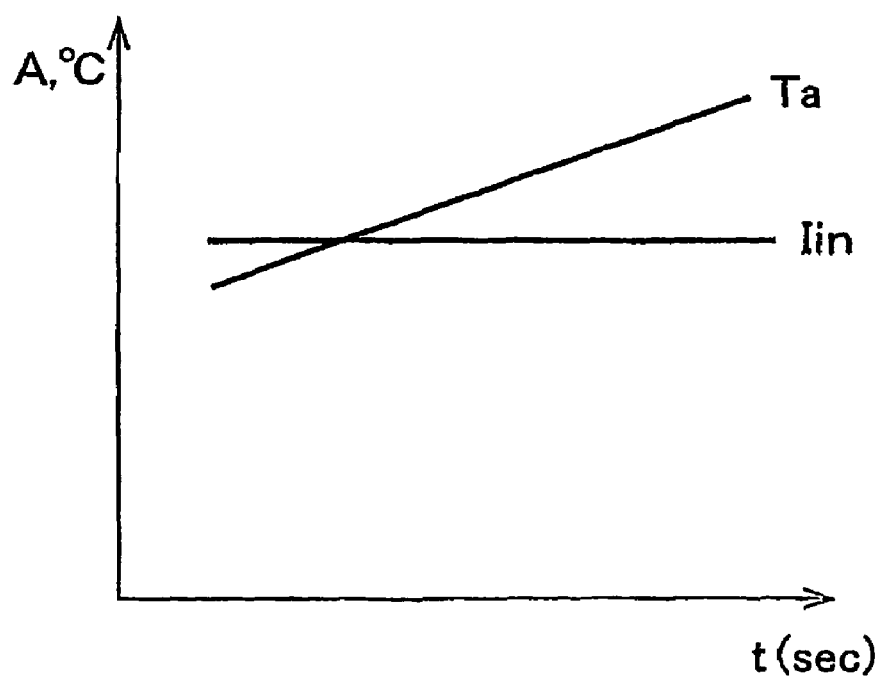
FIG. 17 is a diagram showing a relationship between an atmospheric temperature Ta and an input current Iin according to the high frequency heating apparatus of FIG. 15.

Here, FIG. 16 is a diagram showing a relationship between the resistance value R and the reference value REF of the shunt resistor 102 according to the embodiment. Although the zener voltage of the zener diode 107 is increased and the reference value REF is increased in accordance with a rise in the atmospheric temperature Ta (° C.), also the resistance value of the shunt resistor 102 is similarly increased, detected input current information (Iin×R) is also increased and therefore, a following control is carried out by the control portion 7 by comparing the input current information and the reference value REF and therefore, as shown by a diagram of a relationship between the atmospheric temperature Ta and the input current Iin, even when the atmospheric temperature Ta is elevated, the input current Iin stays to be constant. That is, when an amount of an increase in the reference value REF is similarly compensated for by the resistance value R of the shunt resistor 102, Iin can be made to be constant.

Figure 18:
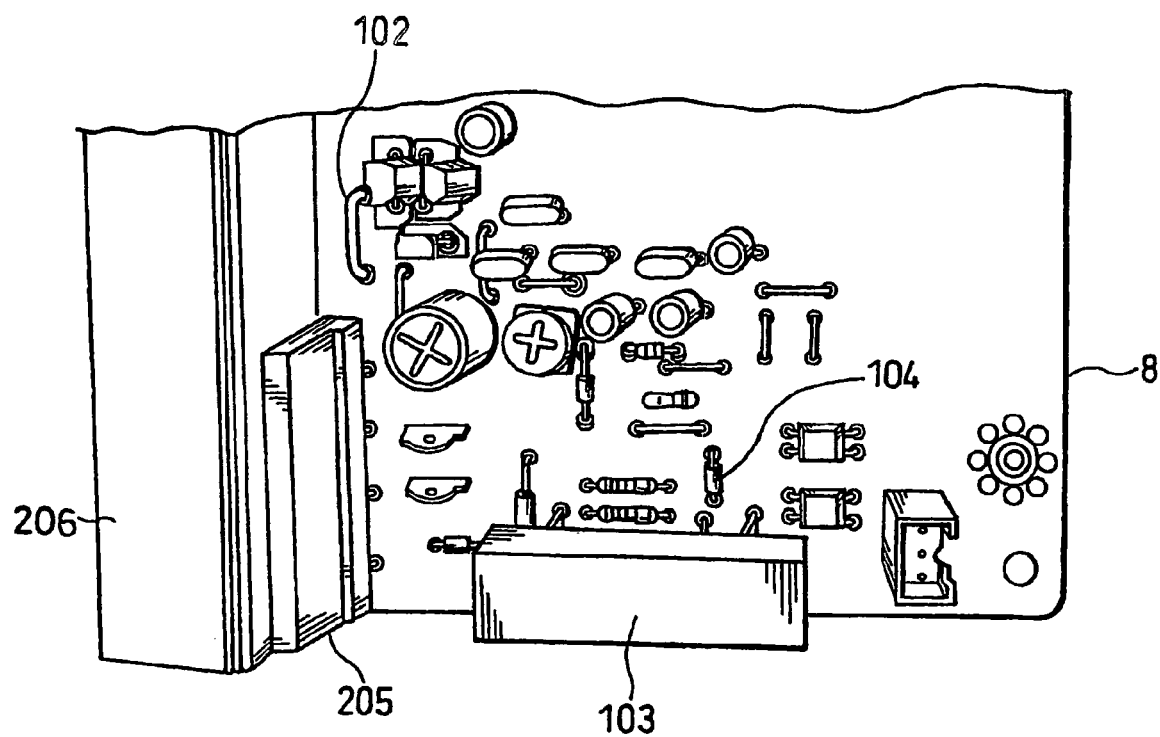
FIG. 18 is a view showing a portion of a printed board mounted with respective parts of the high frequency heating apparatus of FIG. 15.

Further, the shunt resistor 102 is arranged to a vicinity above a printed board mounted with the zener diode 107. That is, the shunt resistor 102 is arranged at a position constituting a temperature atmosphere the same as that of the zener diode 107. FIG. 18 is a view showing an example of mounting, and the shunt resistor 102 and the zener diode 107 are mounted to a region mounted with the cement resistor 103 and IGBT 205 mounted to a heat irradiating plate 206 above the printed board 8. According to the example shown in the drawing, although the shunt resistor 102 is not disposed at the vicinity of the zener diode 107, the shunt resistor 102 is disposed in a thermal atmosphere by heat generation of IGBT 205 and the zener diode 107 is disposed in a thermal atmosphere by heat generation of the cement resistor 103 and can be regarded to be disposed in a similar environment. Naturally, when allowed in view of circuit design, by arranging the shunt resistor 102 at an immediate vicinity of the zener diode 107, the shunt resistor 102 and the zener diode 107 can be disposed in quite the same temperature environment.

In this way, according to the high frequency heating apparatus of the embodiment, there is used the shunt resistor 102 for detecting the input current Iin having the temperature characteristic the same as or proximate to the temperature characteristic of the zener diode 107 used for generating the reference value REF and therefore, even when the reference value REF is increased by increasing the zener voltage in accordance with the rise in the atmospheric temperature, the resistance value of the shunt resistor 102 is increased in the form in which the temperature characteristic of the shunt resistor 102 is approximated to the temperature characteristic of the zener diode 107 and therefore, an error in a correlation between the input current and the reference value can be minimized. That is, the input current can be controlled constant and the accurate high frequency resonating control can be carried out for the magnetron 4.

Further, by arranging the shunt resistor 102 at the vicinity of the zener diode 107, the error in the input current error information can further be minimized.

INDUSTRIAL APPLICABILITY

As has been explained above, according to the high frequency heating apparatus of the invention, there is used the shunt resistor for detecting the input current having the temperature characteristic the same as or proximate to the temperature characteristic of the zener diode and therefore, even when the zener voltage is changed by the rise in the atmospheric temperature and the reference value is changed, the value of the shunt resistor is change by following the change and therefore, the error in the correlation between the input current and the reference value can be minimized, thereby, the accurate high frequency resonating control can be carried out for the magnetron.

Further, when the shunt resistor is disposed under the temperature environment the same as that of the zener diode, the error in the correlation between the input current and the reference value can further be minimized.

The invention claimed is:

1. A high frequency heating apparatus comprising:
   a unidirectional power source portion for converting a commercial power source in a unidirection;
   at least one piece of a semiconductor switching element;
   an inverter portion for converting a power from the unidirectional power source portion into a high frequency power by making the semiconductor switching element to ON/OFF;
   a boost transformer for boosting an output voltage of the inverter portion;
   a high voltage rectifying portion for subjecting an output voltage of the boost transformer to multiplying voltage rectification;
   a magnetron for irradiating an output of the high voltage rectifying portion as an electromagnetic wave;
   a shunt resistor electrically interposed in series with a portion capable of measuring an output current of the unidirectional power source portion and arranged along a wind path of a cooling wind flowing above the board;
   a buffer for outputting a voltage generated by making a current flow to the shunt resistor; and
   a control portion for controlling ON/OFF of the semiconductor switching element to control constant an output of the buffer to a predetermined value.

2. The high frequency heating apparatus according to claim 1, wherein the buffer is provided with an operational amplifier having a high input impedance, and the shunt resistor is interposed between input ends of the operational amplifier via a resistor element.

3. The high frequency heating apparatus according to claim 1, wherein the unidirectional power source portion includes a rectifying element for subjecting an alternating current power source to full-wave rectification, the rectifying element and the semiconductor switching element are attached to a same heat radiating plate, the heat generating plate is formed with a notched portion for ensuring constant distances between respective terminals of the rectifying element and the semiconductor switching element and the heat radiating plate, and the shunt resistor is arranged between the rectifying element and the semiconductor switching element at a vicinity of the heat radiating plate and on a straight line the same as a straight line of the rectifying element and the semiconductor switching element.

4. The high frequency heating apparatus according to claim 3, wherein the shunt resistor is arranged at inside of the notched portion of the heat radiating plate.

5. The high frequency heating apparatus according to claim 1, wherein the shunt resistor is a bare resistor wire.

6. The high frequency heating apparatus according to claim 1, wherein the shunt resistor is arranged in a direction minimizing an area thereof to which the cooling wind is blown.

7. The high frequency heating apparatus according to claim 1, wherein a cement resistor for lowering a voltage of the commercial power source to a predetermined voltage is arranged in a direction substantially intersecting with the wind path of the cooling wind.

8. The high frequency heating apparatus according to claim 1, wherein the cement resistor is arranged on a downstream side of a wind of the shunt resistor.

9. The high frequency heating apparatus according to claim 1, characterized in further comprising a cement resistor for lowering a voltage of the commercial power source to a predetermined voltage;
wherein the shunt resistor is arranged on the board along a wind path of a cooling wind flowing above the board, and the cement resistor is arranged in a space formed between a cooling fin attached with an electronic part generating heat and the boost transformer and at a position cooled by the cooling wind flowing in a clearance formed between the boost transformer and the board.

10. The high frequency heating apparatus according to claim 9, wherein the cement resistor is arranged in a direction substantially intersecting with the wind path of the cooling wind.

11. The high frequency heating apparatus according to claim 1, wherein the shunt resistor is arranged at a conductive through hole on a board.

12. The high frequency heating apparatus according to claim 11, wherein the shunt resistor is a bare resistor wire and the conductive through hole above the board is formed by an eyelet.

13. The high frequency heating apparatus according to claim 11, wherein the shunt resistor is provided with a conductive portion at a surrounding and at two faces of the through hole above the board and the two face conductive portion is soldered.

14. A high frequency heating apparatus comprising:
a rectifying and smoothing portion for generating an inverter power source voltage from the commercial power source;
an inverter portion including a semiconductor switching element for converting a power from the rectifying and smoothing portion into a high frequency power by making the semiconductor switching element ON/OFF;
a shunt resistor for detecting an input current flowing from the rectifying and smoothing portion to the inverter portion;
a direct current power source portion including a zener diode for generating a direct current power source;
a reference value generating portion for generating a reference value for controlling constant the input current from the direct current power source generated by the direct current power source portion; and
a control portion for calculating a difference between the reference value and a value of the input current based on the reference value generated by the reference value generating portion and controlling the inverter portion by adding the difference between the reference value and the input current value at least above a printed board, wherein the shunt resistor is provided with a temperature characteristic the same as or proximate to a temperature characteristic of the zener diode.

15. The high frequency heating apparatus according to claim 14, wherein the shunt resistor is arranged at a vicinity of the zener diode above the printed board.

16. The high frequency heating apparatus according to claim 14, wherein the shunt resistor is arranged above the printed board and at a location under a temperature atmosphere proximate to a temperature atmosphere at a location of arranging the zener diode.

17. A high frequency heating apparatus comprising:
a unidirectional power source portion for converting a commercial power source in a unidirection;
at least one piece of a semiconductor switching element;
an inverter portion for converting a power from the unidirectional power source portion into a high frequency power by making the semiconductor switching element to ON/OFF;
a boost transformer for boosting an output voltage of the inverter portion;
a high voltage rectifying portion for subjecting an output voltage of the boost transformer to multiplying voltage rectification;
a magnetron for irradiating an output of the high voltage rectifying portion as an electromagnetic wave;
a shunt resistor electrically interposed in series with a portion capable of measuring an output current of the unidirectional power source portion;
a buffer for outputting a voltage generated by making a current flow to the shunt resistor; and
a control portion for controlling ON/OFF of the semiconductor switching element to control constant an output of the buffer to a predetermined value, wherein
the unidirectional power source portion includes a rectifying element for subjecting an alternating current power source to full-wave rectification, the rectifying element and the semiconductor switching element are attached to a same heat radiating plate, the heat generating plate is formed with a notched portion for ensuring constant distances between respective terminals of the rectifying element and the semiconductor switching element and the heat radiating plate, and the shunt resistor is arranged between the rectifying element and the semiconductor switching element at a vicinity of the heat radiating plate and on a straight line the same as a straight line of the rectifying element and the semiconductor switching element.

18. A high frequency heating apparatus comprising:
a unidirectional power source portion for converting a commercial power source in a unidirection;
at least one piece of a semiconductor switching element;
an inverter portion for converting a power from the unidirectional power source portion into a high frequency power by making the semiconductor switching element to ON/OFF;
a boost transformer for boosting an output voltage of the inverter portion;
a high voltage rectifying portion for subjecting an output voltage of the boost transformer to multiplying voltage rectification;
a magnetron for irradiating an output of the high voltage rectifying portion as an electromagnetic wave;

a shunt resistor electrically interposed in series with a portion capable of measuring an output current of the unidirectional power source portion;
a buffer for outputting a voltage generated by making a current flow to the shunt resistor;
a control portion for controlling ON/OFF of the semiconductor switching element to control constant an output of the buffer to a predetermined value; and
a cement resistor for lowering a voltage of the commercial power source to a predetermined voltage, wherein the shunt resistor is arranged on the board along a wind path of a cooling wind flowing above the board, and the cement resistor is arranged in a space formed between a cooling fin attached with an electronic part generating heat and the boost transformer and at a position cooled by the cooling wind flowing in a clearance formed between the boost transformer and the board.

* * * * *